United States Patent
Koshimizu

(10) Patent No.: US 8,426,317 B2
(45) Date of Patent: Apr. 23, 2013

(54) PLASMA PROCESSING APPARATUS AND PLASMA PROCESSING METHOD

(75) Inventor: Chishio Koshimizu, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 268 days.

(21) Appl. No.: 12/791,095

(22) Filed: Jun. 1, 2010

(65) Prior Publication Data
US 2010/0304572 A1     Dec. 2, 2010

Related U.S. Application Data

(60) Provisional application No. 61/222,798, filed on Jul. 2, 2009.

(30) Foreign Application Priority Data

Jun. 2, 2009   (JP) ................. 2009-133269

(51) Int. Cl.
*H01L 21/302* (2006.01)
(52) U.S. Cl.
USPC ...... 438/714; 438/710; 438/712; 156/345.24; 156/345.28
(58) Field of Classification Search ................ 438/9, 10, 438/706, 710, 712, 714; 156/345.23, 24, 156/345, 44, 51, 345.25, 28; 216/67, 69
See application file for complete search history.

(56) References Cited

U.S. PATENT DOCUMENTS

| | | | | |
|---|---|---|---|---|
| 5,868,848 A | * | 2/1999 | Tsukamoto | ............... 118/723 E |
| 2004/0177927 A1 | * | 9/2004 | Kikuchi et al. | .......... 156/345.51 |
| 2005/0272227 A1 | * | 12/2005 | Moriya et al. | ................ 438/474 |
| 2007/0215279 A1 | * | 9/2007 | Koshiishi | .................. 156/345.3 |

FOREIGN PATENT DOCUMENTS

| | | |
|---|---|---|
| JP | 2007-250967 A | 9/2007 |
| JP | 2007-258417 A | 10/2007 |

* cited by examiner

*Primary Examiner* — Lan Vinh
(74) *Attorney, Agent, or Firm* — Pearne & Gordon LLP

(57) ABSTRACT

An optimum application voltage for reducing deposits on a peripheral portion of a substrate as well as improving a process result in balance is effectively found without changing a height of a focus ring. A plasma processing apparatus includes a focus ring which includes a dielectric ring provided so as to surround a substrate mounting portion of a mounting table and a conductive ring provided on the dielectric ring; a voltage sensor configured to detect a floating voltage of the conductive ring; a DC power supply configured to apply a DC voltage to the conductive ring. An optimum voltage to be applied to the conductive ring is obtained based on a floating voltage actually detected from the conductive ring, and the optimum application voltage is adjusted based on a variation in the actually detected floating voltage for each plasma process.

14 Claims, 15 Drawing Sheets

*FIG. 10*

| PLASMA PROCESS CONDITION | APPLICATION VOLTAGE DATA ||
|---|---|---|
| | INITIAL OPTIMUM APPLICATION VOLTAGE | INITIAL FLOATING VOLTAGE |
| X | $R_0(X)$ | $F_0(X)$ |
| Y | $R_0(Y)$ | $F_0(Y)$ |
| ⋮ | ⋮ | ⋮ |

*FIG. 13*

| PLASMA PROCESS CONDITION | APPLICATION VOLTAGE DATA | | |
|---|---|---|---|
| | OPTIMUM APPLICATION VOLTAGE OF INNER RING | INITIAL OPTIMUM APPLICATION VOLTAGE OF OUTER RING | INITIAL FLOATING VOLTAGE |
| X | $r_0(X)$ | $R_0(X)$ | $F_0(X)$ |
| Y | $r_0(Y)$ | $R_0(Y)$ | $F_0(Y)$ |
| ⋮ | ⋮ | ⋮ | ⋮ |

PLASMA PROCESSING APPARATUS AND PLASMA PROCESSING METHOD

CROSS-REFERENCE TO RELATED APPLICATION

This application claims the benefit of Japanese Patent Application No. 2009-133269 filed on Jun. 2, 2009, and U.S. Provisional Application Ser. No. 61/222,798 filed on Jul. 2, 2009, the entire disclosures of which are incorporated herein by reference.

FIELD OF THE INVENTION

The present disclosure relates to a plasma processing apparatus including a mounting table for mounting thereon a substrate and a focus ring installed on the mounting table so as to surround the substrate, a plasma processing method, and a program.

BACKGROUND OF THE INVENTION

In manufacturing a semiconductor device, a plasma etching process is repeatedly performed on a substrate such as a semiconductor wafer, a FPD substrate, or a substrate for a solar cell so as to form a micro circuit pattern thereon. In the plasma etching process, for example, plasma is generated by applying a high frequency voltage to electrodes placed to face each other within a depressurizable processing chamber of a plasma processing apparatus, and an etching process is performed on the substrate mounted on a mounting table by using the plasma.

In order to perform a uniform and favorable etching process at a peripheral portion of the substrate as well as at a central portion thereof in the plasma etching process, a focus ring is installed on the mounting table so as to surround the substrate on the mounting table (see Patent Document 1).

Generally, in such a plasma processing apparatus, there has been a problem in that the peripheral portion of the substrate is protruded from the mounting table and there is a gap between the mounting table and the focus ring. Accordingly, plasma products such as CF-based polymers may enter into the gap and be deposited on a bottom surface (rear surface) of the peripheral portion of the substrate.

In order to reduce the deposits on the rear surface of the peripheral portion of the substrate, an electric field is generated by a potential difference between the substrate (mounting table) and the focus ring during a plasma process by insulating the mounting table and the focus ring from each other via a dielectric member provided therebetween, so that ions in the plasma are attracted to and introduced into the peripheral portion of the substrate by such an electric field (see Patent Document 2).

Patent Document 1: Japanese Patent Laid-open Publication No. 2007-258417
Patent Document 2: Japanese Patent Laid-open Publication No. 2007-250967

However, as disclosed in Patent Document 2, for example, when the mounting table and the focus ring are insulated from each other via the dielectric member provided therebetween, a potential difference between the substrate (mounting table) and the focus ring is generated during a plasma process. Therefore, a thickness of a plasma sheath on the substrate is different from that of a plasma sheath on the focus ring. Accordingly, the plasma sheath is deformed, and, thus, an incident angle of ions in the plasma to be attracted to, e.g., the peripheral portion of the substrate may be inclined, resulting in inclination of holes or trenches formed in the peripheral portion.

In this case, a height of the plasma sheath on the focus ring can be adjusted by adjusting a height of a top surface of the focus ring. Therefore, it is possible to suppress deformation of the plasma sheath. For this reason, conventionally, a plurality of focus rings of which top surfaces have various heights are prepared and an optimum focus ring is selected from among the prepared focus rings by testing a plasma process thereon.

However, even if the optimum focus ring is found, the focus ring may be eroded through repeated plasma etching processes and, thus, its height may be changed and the plasma sheath may be deformed again. In such a case, the height of the focus ring cannot be minutely adjusted, and, thus, whenever a process result such as inclination of the holes or the trenches exceeds tolerance, the focus ring should be replaced. Further, if conditions of the plasma etching process are changed, a potential applied to the substrate or a state of the plasma sheath may be changed. Therefore, a focus ring having an optimum height for each process condition should be designed again.

If the height of the top surface of the focus ring is increased, inclination of the plasma sheath above the vicinity of the peripheral portion of the substrate becomes improved. Therefore, the incident angle of the ions to the vicinity of the peripheral portion of the substrate can be nearly vertical, and, thus, the inclination of the holes or the trenches formed in the peripheral portion of the substrate can be improved. However, since the incident angle of the ions in the plasma entered into the gap between the substrate and the focus ring becomes also nearly vertical, it becomes difficult for the ions to reach, e.g., a rear surface of the peripheral portion of the substrate. Accordingly, an effect of reducing the deposits on the peripheral portion of the substrate becomes decreased. As discussed above, there is a tradeoff relation between the inclination of the holes or trenches formed in the peripheral portion of the substrate and the effect of reducing the deposits on a rear surface of the peripheral portion of the substrate. Therefore, it is difficult to improve these both effects in balance only by adjusting the height of the top surface of the focus ring.

Further, it is described in Patent Document 1 that a predetermined DC voltage is applied to a focus ring based on a degree of erosion of the focus ring so as to increase a thickness of a plasma sheath on the focus ring, thereby suppressing deformation of the plasma sheath. However, in order to find an optimum voltage, it is required to detect plasma and predict or detect the degree of erosion of the focus ring. Therefore, process or configuration becomes complicated to find such an optimum voltage or its adjustment voltage. Further, since the focus ring described in Patent Document 1 is directly installed on a mounting table, it is electrically connected with the mounting table without being floated. Accordingly, it is impossible to improve the effect of reducing the deposits on the peripheral portion of the substrate.

Furthermore, it is described in Patent Document 2 that a DC voltage is applied from a variable DC power supply to a focus ring insulated from a mounting table, thereby changing a potential difference between a substrate (mounting table) and the focus ring. However, there is no description of a method of finding an optimum application voltage. Therefore, in case of finding the optimum voltage according to a conventional way as described in Patent Document 1, a process or configuration becomes complicated, and, thus, much time and effort are required. Moreover, improvement in a process result (e.g., improvement in inclination of holes or trenches) at a peripheral portion of a substrate has not been considered in Patent Document 2.

BRIEF SUMMARY OF THE INVENTION

In view of the foregoing, the present disclosure provides a plasma processing apparatus capable of effectively finding an optimum voltage to be applied to a conductive ring in order to reduce deposits on a peripheral portion of a substrate as well as improve a process result in balance and capable of accurately and simply adjusting the optimum application voltage without changing a shape (e.g., height of a top surface) of a focus ring.

The present inventor has studied a method of effectively finding an optimum application voltage in order to increase both the effect of reducing deposits on a peripheral portion of a substrate and the effect of improving a process result (e.g., improving inclination of an etching profile) without changing a shape (e.g., height of a top surface) of a focus ring. As a result of the study, it has been found that when a focus ring is configured such that a conductive ring is installed in a floating state on a dielectric ring provided on a mounting table, if plasma is generated, a floating voltage is generated at the conductive ring. In this case, an application voltage can be determined to be in the range from an electric potential of the conductive ring by the floating voltage to an electric potential of the plasma. Therefore, it is possible to effectively find the optimum application voltage for reducing the deposits on the peripheral portion of the substrate as well as improving the process result in balance.

Further, the floating voltage may vary depending on the degree of erosion of the focus ring or a change in a state of the plasma. Accordingly, it has been found that even if the focus ring is eroded, it is possible to maintain an optimum state regardless of the change of the floating voltage by using an accurate and simple method of adjusting the optimum application voltage for each plasma process depending on a variation in the floating voltage. The disclosures to be described below are based on such knowledge.

In accordance with an aspect of the present disclosure, there is provided a plasma processing method for performing a plasma process on a substrate in a plasma processing apparatus which includes a mounting table for mounting thereon the substrate and a focus ring provided on the mounting table so as to surround the substrate. The focus ring includes a dielectric ring provided so as to surround a substrate mounting portion of the mounting table and a conductive ring provided on the dielectric ring. The conductive ring is connected with a voltage sensor for detecting a floating voltage thereof and a DC power supply for applying a DC voltage thereto. The conductive ring includes an outer ring and an inner ring as one body. The outer ring is provided so as to surround a peripheral portion of the substrate and has a top surface higher than the substrate mounted on the substrate mounting portion, and the inner ring is extended inwardly from the outer ring so as to be positioned under the peripheral portion of the substrate and has a top surface lower than the substrate. Further, the plasma processing method includes obtaining an optimum application voltage value to be applied to the conductive ring (for example, an optimum application voltage value most suitable to increase both an effect of reducing deposits on the peripheral portion of the substrate and an improvement in a process result) based on a floating voltage of the conductive ring detected by the voltage sensor and storing the obtained optimum application voltage value in a storage; detecting a floating voltage of the conductive ring by the voltage sensor for each plasma process when a plasma process is performed, obtaining a variation of the floating voltage, and adjusting the optimum application voltage value stored in the storage based on the variation in the floating voltage; and performing the plasma process on the substrate by applying a voltage corresponding to the adjusted optimum application voltage value to the conductive ring from the DC power supply.

In accordance with another aspect of the present disclosure, there is provided a plasma processing apparatus for performing a plasma process on a substrate mounted on a mounting table. The apparatus includes a focus ring which includes a dielectric ring provided so as to surround a substrate mounting portion of the mounting table and a conductive ring provided on the dielectric ring and having an outer ring and an inner ring as one body; a voltage sensor configured to detect a floating voltage of the conductive ring; a DC power supply configured to apply a DC voltage to the conductive ring; a storage configured to store therein an optimum application voltage value to be applied to the conductive ring (for example, an optimum application voltage value most suitable to increase both an effect of reducing deposits on the peripheral portion of the substrate and an improvement in a process result) which is obtained based on the floating voltage of the conductive ring detected by the voltage sensor; and a controller configured to detect a floating voltage of the conductive ring by the voltage sensor for each plasma process when a plasma process is performed, to obtain a variation in the floating voltage, to adjust the optimum application voltage value stored in the storage based on the variation in the floating voltage, and to perform the plasma process on the substrate by applying a voltage corresponding to the adjusted optimum application voltage value to the conductive ring from the DC power supply. The outer ring may be provided so as to surround a peripheral portion of the substrate and have a top surface higher than the substrate mounted on the substrate mounting portion. Further, the inner ring may be extended inwardly from the outer ring so as to be positioned under the peripheral portion of the substrate and have a top surface lower than the substrate.

In accordance with still another aspect of the present disclosure, there is provided a computer-executable program for performing a plasma processing method by using a plasma processing apparatus which performs a plasma process on a substrate mounted on a mounting table. The plasma processing apparatus includes a focus ring which includes a dielectric ring provided so as to surround a substrate mounting portion of the mounting table and a conductive ring provided on the dielectric ring and having an outer ring and an inner ring as one body; a voltage sensor configured to detect a floating voltage of the conductive ring; a DC power supply configured to apply a DC voltage to the conductive ring; and a storage configured to store therein an optimum application voltage value to be applied to the conductive ring (for example, the optimum application voltage value most suitable to increase both an effect of reducing deposits on the peripheral portion of the substrate and an improvement in a process result), which is obtained based on the floating voltage of the conductive ring detected by the voltage sensor. Further, the outer ring may be provided so as to surround a peripheral portion of the substrate and have a top surface higher than the substrate mounted on the substrate mounting portion, and the inner ring may be extended inwardly from the outer ring so as to be positioned under the peripheral portion of the substrate and have a top surface lower than the substrate. The plasma processing method includes detecting a floating voltage of the conductive ring by the voltage sensor for each plasma process when a plasma process is performed, obtaining a variation in the floating voltage, and adjusting the optimum application voltage value stored in the storage based on the variation in the floating voltage; and performing the plasma process on the substrate by applying a voltage corresponding to the adjusted optimum application voltage value to the conductive ring from the DC power supply.

In the apparatus, the method, and the program in accordance with the present disclosure, the optimum voltage to be applied to the conductive ring is found based on the floating voltage actually detected from the conductive ring, and the optimum application voltage is adjusted based on a variation obtained from the actually detected floating voltage for each plasma process. Accordingly, it is possible to find the optimum application voltage for reducing the deposits on the peripheral portion of the substrate as well as improving the process result in balance without changing a height (height of the top surface) of the focus ring, and it is possible to accurately and simply adjust the optimum application voltage. Therefore, a frequency of replacement of the focus ring can be reduced as compared to the conventional method, so that it is possible to decrease a downtime or cost for components required for replacement as compared to the conventional method.

Further, if it is allowed to select one among a plurality of plasma process conditions, the plasma processing method may further include obtaining an optimum application voltage value to be applied to the conductive ring based on a floating voltage of the conductive ring detected by the voltage sensor for each of the plasma process conditions and storing the obtained optimum application voltage value in the storage; detecting a floating voltage of the conductive ring by the voltage sensor for each plasma process when a plasma process is performed under the selected plasma process condition, obtaining a variation of the floating voltage, and adjusting the optimum application voltage value stored in the storage and related to the selected plasma process condition based on the variation in the floating voltage; and performing the plasma process on the substrate under the plasma process condition by applying a voltage corresponding to the adjusted optimum application voltage value to the conductive ring from the DC power supply. Since the optimum application voltage for each plasma process condition can be effectively found, it is possible to accurately and simply adjust the optimum application voltage for each plasma process condition.

Furthermore, the outer ring may be divided into an outer peripheral portion and an inner peripheral portion. The inner peripheral portion may be electrically connected with the inner ring and the outer peripheral portion may be electrically insulated from the inner peripheral portion and the inner ring. The DC power supply and the voltage sensor may be connected with the inner peripheral portion or the inner ring. Accordingly, an application area on the outer ring can be reduced, and, thus, it is possible to miniaturize the DC power supply.

In accordance with still another aspect of the present disclosure, there is provided a plasma processing method for performing a plasma process on a substrate in a plasma processing apparatus which includes a mounting table for mounting thereon the substrate and a focus ring provided on the mounting table so as to surround the substrate. The focus ring includes a dielectric ring provided so as to surround a substrate mounting portion of the mounting table and a conductive ring provided on the dielectric ring. The conductive ring includes an outer ring and an inner ring as separate bodies. The outer ring is provided so as to surround a peripheral portion of the substrate and has a top surface higher than the substrate mounted on the substrate mounting portion, and the inner ring is spaced apart inwardly from the outer ring so as to be positioned under the peripheral portion of the substrate and has a top surface lower than the substrate. The outer ring and the inner ring are connected with a DC power supply for the outer ring and a DC power supply for the inner ring, respectively, and the outer ring is connected with a voltage sensor for detecting a floating voltage thereof. Further, the plasma processing method includes obtaining an optimum application voltage value to be applied to the outer ring (for example, an optimum application voltage value of the outer ring most suitable to increase both an effect of reducing deposits on the peripheral portion of the substrate and an improvement in a process result) based on a floating voltage of the outer ring detected by the voltage sensor and an optimum application voltage value to be applied to the inner ring (for example, an optimum application voltage value of the inner ring most suitable to increase both an effect of reducing deposits on the peripheral portion of the substrate and an improvement in a process result), and storing the obtained optimum application voltage values in a storage; detecting a floating voltage of the outer ring by the voltage sensor for each plasma process when a plasma process is performed, obtaining a variation in the floating voltage, and adjusting the optimum application voltage value of the outer ring stored in the storage based on the variation in the floating voltage; and performing the plasma process on the substrate by applying a voltage corresponding to the adjusted optimum application voltage value of the outer ring to the outer ring from the DC power supply for the outer ring and by applying a voltage corresponding to the optimum application voltage value of the inner ring stored in the storage to the inner ring from the DC power supply for the inner ring.

In accordance with still another aspect of the present disclosure, there is provided a plasma processing apparatus performing a plasma process on a substrate mounted on a mounting table. The apparatus includes a focus ring which includes a dielectric ring provided so as to surround a substrate mounting portion of the mounting table and a conductive ring provided on the dielectric ring and having an outer ring and an inner ring as separate bodies; a voltage sensor configured to detect a floating voltage of the outer ring; a DC power supply for the outer ring configured to apply a DC voltage to the outer ring; a DC power supply for the inner ring configured to apply a DC voltage to the inner ring; a storage configured to store therein an optimum application voltage value to be applied to the outer ring (for example, an optimum application voltage value of the outer ring most suitable to increase both an effect of reducing deposits on the peripheral portion of the substrate and an improvement in a process result) and an optimum application voltage value to be applied to the inner ring (for example, the optimum application voltage value of the inner ring most suitable to increase both an effect of reducing deposits on the peripheral portion of the substrate and an improvement in a process result), the optimum application voltage value to be applied to the outer ring being obtained based on the floating voltage of the outer ring detected by the voltage sensor; and a controller configured to detect a floating voltage of the outer ring by the voltage sensor for each plasma process when a plasma process is formed, to obtain a variation in the floating voltage, to adjust the optimum application voltage value of the outer ring stored in the storage based on the variation in the floating voltage, and to perform the plasma process on the substrate by applying a voltage corresponding to the adjusted optimum application voltage value of the outer ring to the outer ring from the DC power supply for the outer ring and by applying a voltage corresponding to the optimum application voltage value of the inner ring stored in the storage to the inner ring from the DC power supply for the inner ring. The outer ring may be provided so as to surround a peripheral portion of the substrate and have a top surface higher than the substrate mounted on the substrate mounting portion. Further, the inner ring may be spaced apart inwardly from the outer ring and provided so as to be positioned under the peripheral portion of the substrate and have a top surface lower than the substrate.

In accordance with still another aspect of the present disclosure, there is provided a computer-executable program for performing a plasma processing method by using a plasma processing apparatus which performs a plasma process on a substrate mounted on a mounting table. The plasma processing apparatus includes a focus ring which includes a dielectric ring provided so as to surround a substrate mounting portion of the mounting table and a conductive ring provided on the dielectric ring and having an outer ring and an inner ring as separate bodies; a voltage sensor configured to detect a floating voltage of the outer ring; a DC power supply for the outer ring configured to apply a DC voltage to the outer ring; a DC power supply for the inner ring configured to apply a DC voltage to the inner ring; and a storage configured to store therein an optimum application voltage value to be applied to the outer ring (for example, an optimum application voltage value of the outer ring most suitable to increase both an effect of reducing deposits on the peripheral portion of the substrate and an improvement in a process result) and an optimum application voltage value to be applied to the inner ring (for example, the optimum application voltage value of the inner ring most suitable to increase both an effect of reducing deposits on the peripheral portion of the substrate and an improvement in a process result). The optimum application voltage value to be applied to the outer ring is obtained based on the floating voltage of the outer ring detected by the voltage sensor. Further, the outer ring may be provided so as to surround a peripheral portion of the substrate and have a top surface higher than the substrate mounted on the substrate mounting portion, and the inner ring may be spaced apart inwardly from the outer ring and provided so as to be positioned under the peripheral portion of the substrate and have a top surface lower than the substrate. The plasma processing method includes detecting a floating voltage of the outer ring by the voltage sensor for each plasma process when a plasma process is formed, obtaining a variation in the floating voltage, and adjusting the optimum application voltage value of the outer ring stored in the storage based on the variation in the floating voltage; and performing the plasma process on the substrate by applying a voltage corresponding to the adjusted optimum application voltage value of the outer ring to the outer ring from the DC power supply for the outer ring and by applying a voltage corresponding to the optimum application voltage value of the inner ring stored in the storage to the inner ring from the DC power supply for the inner ring.

In the apparatus, the method, and the program in accordance with the present disclosure, the optimum voltage to be applied to the outer ring is found based on the floating voltage actually detected from the outer ring, and the optimum application voltage to be applied to the inner ring can be found separately. Further, the optimum application voltage for the outer ring is adjusted based on a variation obtained from the actually detected floating voltage for each plasma process. Accordingly, it is possible to find the optimum application voltage for reducing the deposits on the peripheral portion of the substrate as well as improving the process result in balance without changing a height (height of the top surface) of the focus ring, and it is possible to accurately and simply adjust the optimum application voltage. Furthermore, different DC voltages from each other can be applied to the outer ring and the inner ring, and, thus, it is possible to secure a potential difference between the inner ring and the substrate and also possible to adjust the voltage to be applied to the outer ring. Therefore, even if the optimum application voltage for the outer ring is adjusted greatly, it is possible to reduce the deposits on the peripheral portion of the substrate and improve the process result in balance. Therefore, a frequency of replacement of the focus ring can be reduced, so that it is possible to decrease a downtime or cost for components required for replacement as compared to the conventional method.

Further, if it is allowed to select one among a plurality of plasma process conditions, the plasma processing method may further include obtaining an optimum application voltage value to be applied to the outer ring based on a floating voltage of the outer ring detected by the voltage sensor for each of the plasma process conditions, obtaining an optimum application voltage value to be applied to the inner ring for each of the plasma process conditions, and storing the obtained optimum application voltage values in the storage; detecting a floating voltage of the outer ring by the voltage sensor under the selected plasma process condition when a plasma process is performed, obtaining a variation of the floating voltage, and adjusting the optimum application voltage value of the outer ring stored in the storage and related to the selected plasma process condition based on the variation in the floating voltage; and performing the plasma process on the substrate by applying a voltage corresponding to the adjusted optimum application voltage value of the outer ring to the outer ring from the DC power supply for the outer ring and by applying a voltage corresponding to the optimum application voltage value of the inner ring stored in the storage and related to the selected plasma process condition to the inner ring from the DC power supply for the inner ring. With respect to each plasma process condition, the optimum application voltage for the outer ring and the inner ring can be effectively found, and, thus, it is possible to accurately and simply adjust the optimum application voltage for the outer ring with respect to each plasma process condition.

Furthermore, the outer ring may be divided into an outer peripheral portion and an inner peripheral portion. The inner peripheral portion may be electrically insulated from the inner ring and the outer peripheral portion may be electrically insulated from the inner peripheral portion and the inner ring. The DC power supply for the outer ring and the voltage sensor may be connected with the inner peripheral portion. Accordingly, an application area on the outer ring can be reduced, and, thus, it is possible to miniaturize the DC power supply for the outer ring.

In accordance with the present disclosure, a focus ring includes a dielectric ring on a mounting table and a conductive ring on the dielectric ring. The optimum application voltage to be applied to the conductive ring is found based on the actually detected floating voltage, so that it is possible to find the optimum application voltage capable of reducing the deposits on the peripheral portion of the substrate as well as improving the process result. Further, the optimum application voltage is adjusted for each plasma process based on a variation in the floating voltage, and, thus, it is possible to accurately and simply adjust the voltage. Accordingly, even if the focus ring is eroded, it is possible to maintain an optimum state regardless of the change of the floating voltage.

BRIEF DESCRIPTION OF THE DRAWINGS

The disclosure may best be understood by reference to the following description taken in conjunction with the following figures:

FIG. 10 shows a specific example of application voltage data in case of using the focus ring device illustrated in FIG. 7;

FIG. 13 shows a specific example of application voltage data in case of using the focus ring device illustrated in FIG. 11;

DETAILED DESCRIPTION OF THE INVENTION

Figure 1:
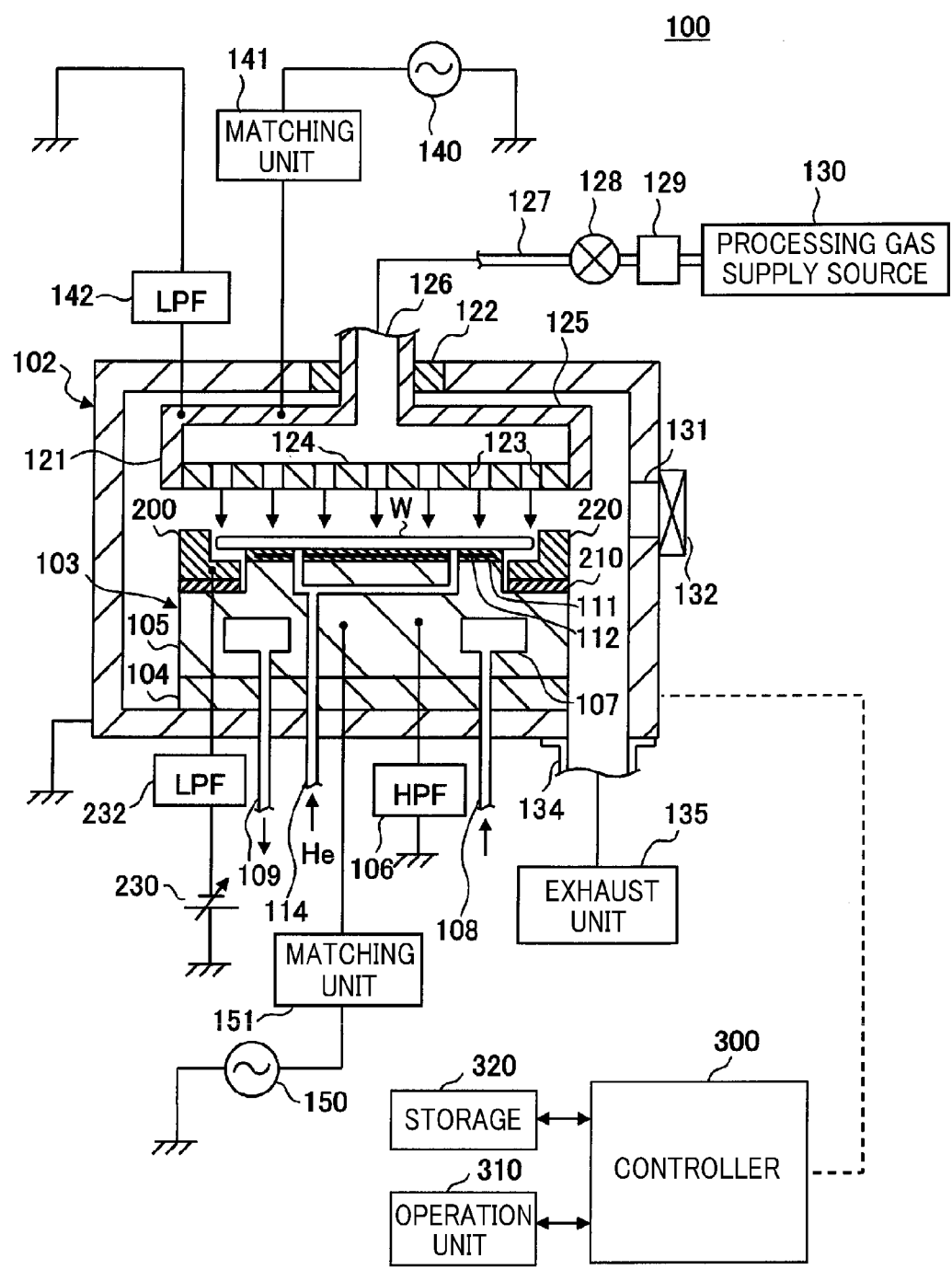
FIG. 1 is a cross sectional view of a schematic configuration of a plasma processing apparatus in accordance with an embodiment of the present disclosure.

Hereinafter, embodiments of the present disclosure will be described in detail with reference to the accompanying drawings. In this specification and drawings, same parts having substantially the same function and configuration will be assigned same reference numerals, and redundant explanation thereof will be omitted.

(Configuration Example of Plasma Processing Apparatus)

First, there will be explained a schematic configuration of a plasma processing apparatus in accordance with an embodiment of the present disclosure with reference to the accompanying drawings. FIG. 1 is a cross sectional view of a schematic configuration of the plasma processing apparatus in accordance with the present embodiment. Hereinafter, as one example of the plasma processing apparatus, a parallel plate type plasma etching apparatus will be described.

For example, a plasma processing apparatus 100 includes a processing chamber 102 having a cylindrical processing vessel made of aluminum whose surface is anodically oxidized (alumite-treated). The processing chamber 102 is grounded. Installed on a bottom portion of the processing chamber 102 is a substantially cylindrical mounting table 103 for mounting thereon a wafer W. The mounting table 103 includes an insulating plate 104 made of ceramic or the like and a susceptor 105 which is installed on the insulating plate 104 and serves as a lower electrode.

Provided within the susceptor 105 is a temperature control medium container 107. Further, a temperature control medium is introduced into and circulated in the temperature control medium container 107 through an introduction line 108 and then discharged through a discharge line 109. The susceptor 105 can be controlled at a predetermined temperature by such a circulation of the temperature control medium.

On an upper central portion of the susceptor 105, a substrate mounting portion having a protruded shape is formed. Provided on the substrate mounting portion is an electrostatic chuck 111. The electrostatic chuck 111 includes an electrode 112 in an insulating member. A DC voltage of, e.g., about 1.5 kV is applied from a non-illustrated DC power supply connected with the electrode 112 to the electrostatic chuck 111, so that the wafer W is electrostatically attracted onto the electrostatic chuck 111. The substrate mounting portion has a smaller diameter than that of the wafer W, and, thus, a peripheral portion of the wafer W is protruded from the substrate mounting portion when the wafer W is mounted thereon.

At an upper peripheral portion of the susceptor 105, a focus ring 200 is arranged so as to surround the wafer W mounted on the electrostatic chuck 111 of the substrate mounting portion. The focus ring 200 includes a ring-shaped dielectric ring 210 placed on the susceptor 105 and a ring-shaped conductive ring 220 placed on the dielectric ring 210. The detailed configuration of the focus ring 200 will be described later.

Formed through the insulating plate 104, the susceptor 105, and the electrostatic chuck 111 is a gas passage 114 for supplying a heat transfer medium (for example, a backside gas such as a He gas) to a rear surface of the wafer W. Through this heat transfer medium, heat is transferred between the susceptor 105 and the wafer W, and, thus, the wafer W is maintained at a predetermined temperature.

Further, installed above the susceptor 105 is an upper electrode 121 facing the susceptor 105 parallel to each other. The upper electrode 121 is supported within the processing chamber 102 by an insulating member 122. The upper electrode 121 includes an electrode plate 124 serving as a facing surface to the susceptor 105 and having a plurality of discharge holes 123, and an electrode support 125 for supporting the electrode plate 124. The electrode plate 124 is made of, e.g., quartz and the electrode support 125 is made of a conductive material such as aluminum with its top surface alumite-treated. Furthermore, a distance between the susceptor 105 and the upper electrode 121 can be adjusted.

A gas inlet opening 126 is provided at the center of the electrode support 125 of the upper electrode 121. The gas inlet opening 126 is connected with a gas supply line 127. Further, the gas supply line 127 is connected with a processing gas supply source 130 via a valve 128 and a mass flow controller 129.

The processing gas supply source 130 supplies an etching gas for plasma etching. Although only one processing gas supply system including the gas supply line 127, the valve 128, the mass flow controller 129, and the processing gas supply source 130 is illustrated in FIG. 1, the plasma processing apparatus 100 may include a plurality of processing gas supply systems. For example, etching gasses such as $CF_4$, $O_2$, $N_2$, and $CHF_3$ may be supplied into the processing chamber 102, with their flow rates controlled independently.

The bottom portion of the processing chamber 102 is connected with an exhaust pipe 134 which is connected with an exhaust unit 135. The exhaust unit 135 includes a vacuum pump such as a turbo molecular pump and controls the inside of the processing chamber 102 to be in a predetermined depressurized atmosphere. Formed in a sidewall of the processing chamber 102 is a loading/unloading port 131 for the wafer W. A gate valve 132 is provided on the loading/unloading port 131. In order to load/unload the wafer W, the gate valve 132 is opened and then the wafer W is loaded/unloaded by a non-illustrated transfer arm through the loading/unloading port 131.

The upper electrode 121 is connected with a first high frequency power supply 140 via a first matching unit 141 which is provided on a power supply line. The first high frequency power supply 140 is capable of outputting a high frequency power for plasma generation having a frequency ranging from about 50 MHz to about 150 MHz. By applying such a high frequency power to the upper electrode 121, high density plasma in a desirable dissociation state can be generated within the processing chamber 102, and, thus, a plasma process can be performed under a lower pressure condition. A frequency of an output power of the first high frequency power supply 140 is in the range from about 50 MHz to about 80 MHz, desirably and typically, the frequency is controlled to be about 60 MHz.

The susceptor 105 serving as a lower electrode is connected with a second high frequency power supply 150 via a second matching unit 151 which is provided on a power supply line. The second high frequency power supply 150 is capable of outputting a high frequency bias power having a frequency ranging from about several hundreds kHz to about several tens MHz. Typically, a frequency of an output power of the second high frequency power supply 150 is controlled to be about 2 MHz or about 13.56 MHz.

Further, the susceptor 105 is connected with a high pass filter (HPF) 106 for filtering a high frequency current introduced to the susceptor 105 from the second high frequency power supply 150. The upper electrode 121 is connected with a low pass filter (LPF) 142 for filtering a high frequency current introduced to the upper electrode 121 from the first high frequency power supply 140.

The plasma processing apparatus 100 is connected with a controller (overall controller) 300 which controls the respective units of the plasma processing apparatus 100. Further, the controller 300 is connected with an operation unit 310 including a key board through which an operator inputs commands to manage the plasma processing apparatus and a display for visualizing and displaying an operation status of the plasma processing apparatus 100.

The controller 300 is connected with a storage 320 which stores therein: programs for executing various processes performed in the plasma processing apparatus under the control of the controller 300; and process conditions (recipes) required for executing the programs.

The storage 320 stores therein a plurality of plasma process conditions (recipes), for example. These plasma process conditions specify a plurality of parameter values such as control parameters and setting parameters for controlling the respective units of the plasma processing apparatus 100. Each of the plasma process conditions has parameter values such as flow rate ratio of the processing gas, an internal pressure of the processing chamber, and a high frequency power. Further, in the present embodiment, each plasma process condition includes application voltage data for applying a voltage to the focus ring 200 (see, for example, FIGS. 10 and 13). The details of the application voltage data will be described later.

The programs or the plasma process conditions may be stored in a hard disc or a semiconductor memory, or may be set at a predetermined position of the storage 320 while being stored in a storage medium, such as a CD-ROM or a DVD, readable by a portable computer.

The controller 300 reads a required program and process condition from the storage 320 in response to instructions from the operation unit 310 and controls the respective units, so that a required process is performed in the plasma processing apparatus 100. Further, the process conditions can be edited by operation from the operation unit 310.

In the plasma processing apparatus 100 configured as stated above, for example, when a plasma etching process is performed on the wafer W, the wafer W is loaded into the processing chamber 102 by a non-illustrated transfer arm, mounted on the mounting table 103, and electrostatically attracted to the electrostatic chuck 111. Thereafter, a predetermined processing gas is introduced into the processing chamber 102 from the processing gas supply source 130, and the inside of the processing chamber 102 is evacuated by the exhaust unit 135, thereby depressurizing the inside of the processing chamber 102 to a predetermined vacuum pressure.

In this way, with the predetermined vacuum pressure maintained, a high frequency power for plasma generation having a frequency of, e.g., about 60 MHz is applied to the upper electrode 121 from the first high frequency power supply 140 and a high frequency bias power having a frequency of, e.g., about 2 MHz is applied to the susceptor 105 from the second high frequency power supply 150, so that plasma of the processing gas is generated above the wafer W by the high frequency power for plasma generation and a self-bias potential is generated on the wafer W (susceptor 105) by the high frequency bias power. Accordingly, a plasma sheath electric field caused by a plasma potential and a wafer potential (susceptor potential) is generated on the wafer W, and ions in the plasma are attracted to the wafer. In this way, the etching process proceeds.

(Configuration of Focus Ring)

Figure 2:
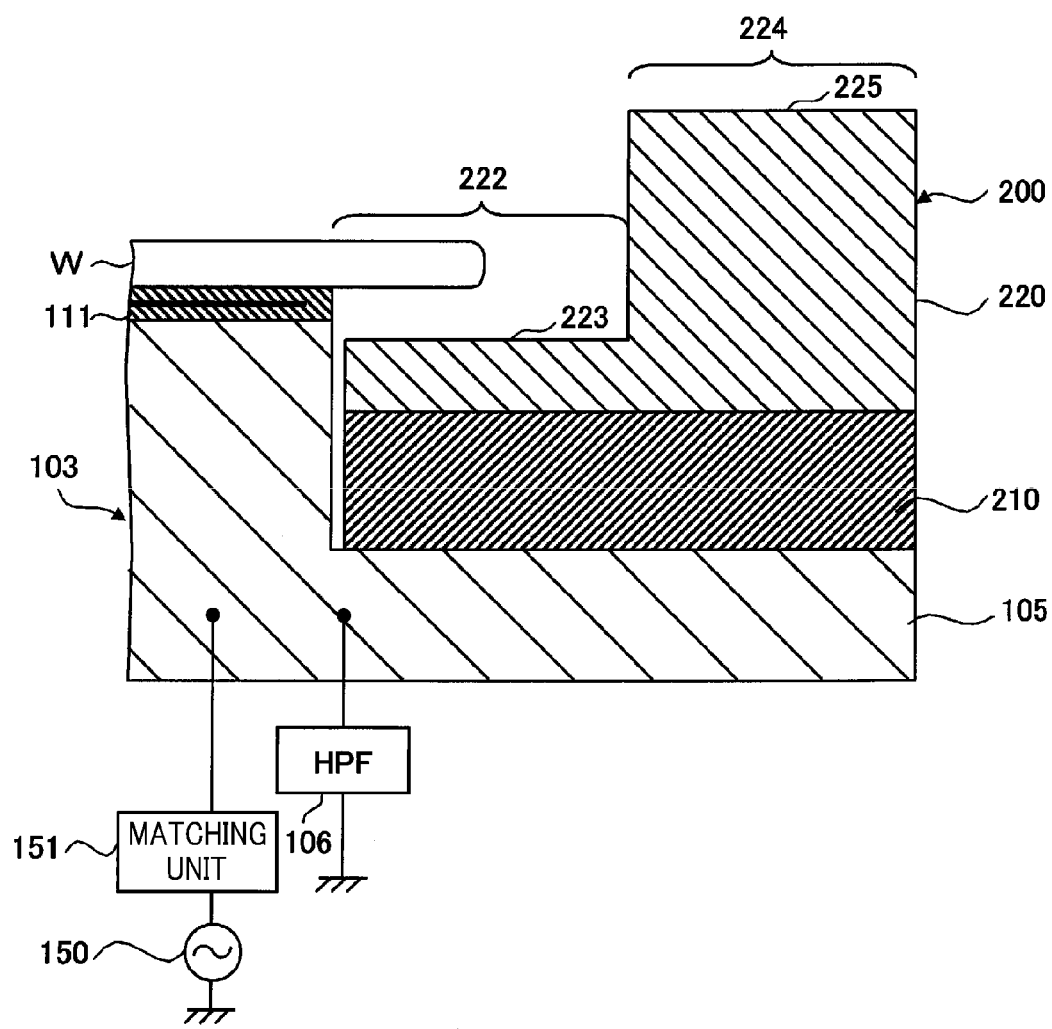
FIG. 2 is a partial cross sectional view for showing a configuration of a focus ring in accordance with the present embodiment.

Hereinafter, a specific example configuration of the focus ring 200 illustrated in FIG. 1 will be explained in detail with reference to the drawings. FIG. 2 is a partial cross sectional view for explaining a configuration of a focus ring. As depicted in FIG. 2, the focus ring 200 includes the dielectric ring 210 placed on the susceptor 105 and the conductive ring 220 placed on the dielectric ring 210. The dielectric ring 210 is made of a dielectric material, e.g., ceramics such as quartz, alumina, or a resin such as Bespel (registered trademark). The conductive ring 220 is made of a conductive material such as Si (Si doped with B (boron) or the like for conductivity), C, or SiC.

The conductive ring 220 includes an outer ring 224 and an inner ring 222, which extends inwardly from the outer ring 224, as one body. Top surfaces of them are positioned at different heights from each other. That is, a top surface 225 of the outer ring 224 is formed to be higher than a top surface of the wafer W, and a top surface 223 of the inner ring 222 is formed to be lower than a bottom surface of the wafer W. The outer ring 224 is spaced from an outer peripheral portion of the wafer W so as to surround its circumference. The inner ring 222 is spaced from a lower peripheral portion of the wafer W.

In FIG. 2, the inner ring 222 and the outer ring 224 are formed as one body and electrically connected with each other. Further, the inner ring 222 and the outer ring 224 are electrically insulated from the susceptor 105 by the dielectric ring 210. Furthermore, the conductive ring 220 (including the outer ring 224 and the inner ring 222) are in electrical contact with only the dielectric ring 210, and, thus, the conductive ring 220 is in an electrically floating state (insulating state) with respect to a ground. In the floating state, a potential difference is generated between the conductive ring 220 and the susceptor 105 (wafer W), thereby reducing deposits on the peripheral portion of the wafer W.

Figure 3:
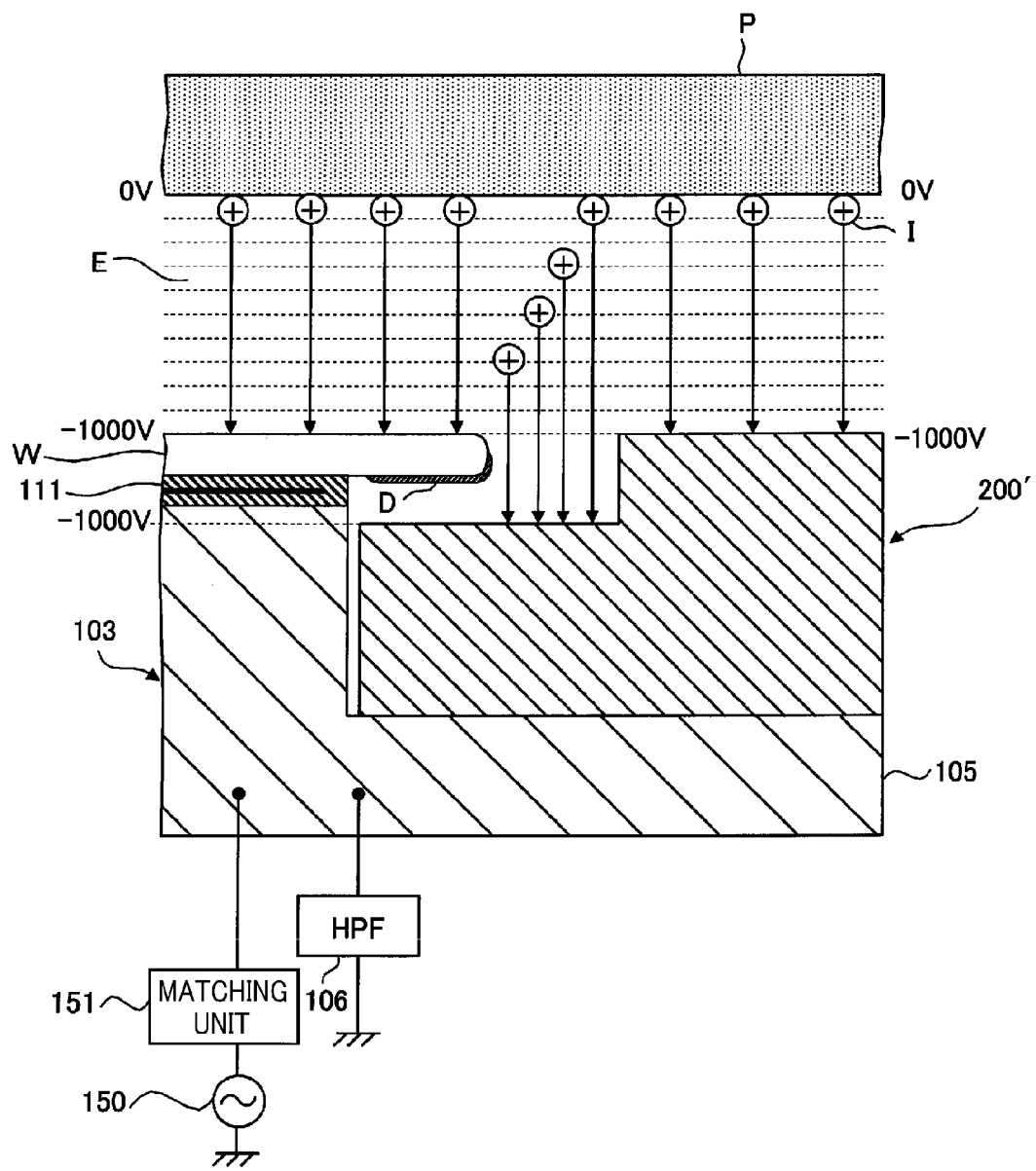
FIG. 3 is a view for explaining an operation of a focus ring in a non-floating state with respect to a susceptor in accordance with a comparative example.
Figure 4:
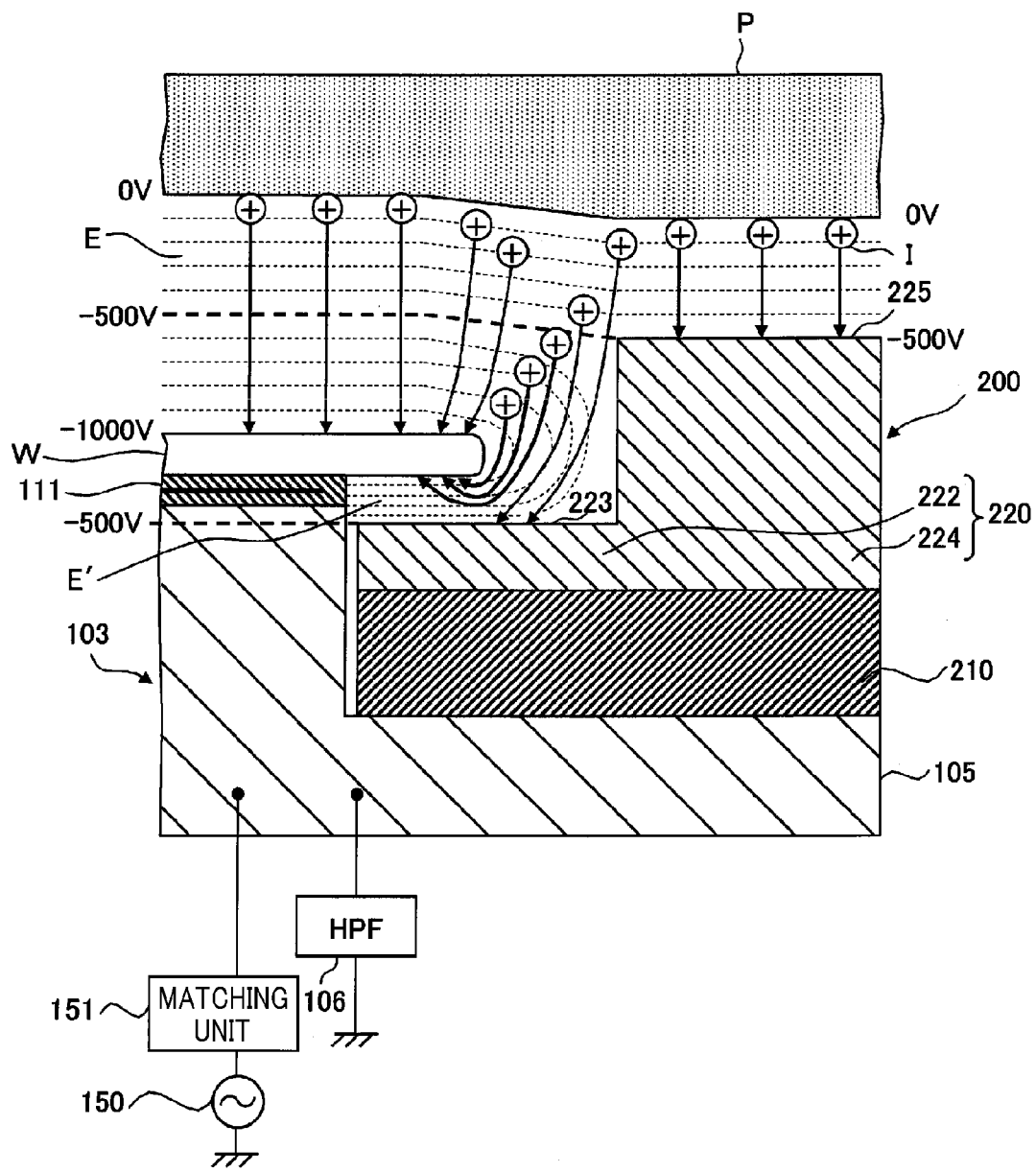
FIG. 4 is a view for explaining an operation of a focus ring in a floating state with respect to a susceptor in accordance with the present embodiment.

Hereinafter, an operation of the focus ring 200 in the floating state with respect to the susceptor 105 will be explained in comparison with a focus ring 200' in a non-floating state in accordance with a comparative example. FIG. 3 is a view for explaining an operation of the focus ring 200' in a non-floating state during a plasma process. FIG. 4 is a view for explaining an operation of the focus ring 200 in a floating state during a plasma process.

The focus ring 200' illustrated in FIG. 3 is in electrical contact with the susceptor 105 and the top surface of the focus ring 200' is formed to be as high as that of the wafer W. Meanwhile, the focus ring 200 illustrated in FIG. 4 is not in electrical contact with the susceptor 105 and the top surface of the focus ring 200 is formed to be higher than that of the wafer W in the same manner as the present embodiment.

The focus ring 200' illustrated in FIG. 3 is electrically connected with the susceptor 105, and, thus, if a voltage of the susceptor 105 (voltage of the wafer W) is, for example, about −1000 V during a plasma process, the top surface of the focus ring 200' also has the same voltage of about −1000 V.

In this case, a plasma sheath electric field E is generated between plasma P and the top surface of the wafer W and between the plasma P and the top surface of the focus ring 200'. Since the top surface of the focus ring 200' has the substantially same height as that of the top surface of the wafer W, a thickness of the plasma sheath ranging from on the wafer W to on the focus ring 200' is substantially uniform. Therefore, equipotential surfaces of the electric field E are approximately parallel with each other.

By such an operation of the electric field E, ions I from the plasma P are attracted to the top surface of the wafer W and to the top surface of the focus ring 200' in a substantially vertical manner. Therefore, the ions I moving toward the vicinity of the peripheral portion of the wafer W are also attracted in a substantially vertical manner. Further, since there is no potential difference between the wafer W and the focus ring 200', even if the ions I are incident to a gap between the wafer peripheral portion and the focus ring 200', it is difficult for the ions I to reach a side surface or rear surface of the wafer peripheral portion. For this reason, deposits (deposition) D such as polymers may be easily deposited on the side surface or bottom surface (rear surface) of the wafer peripheral portion.

Meanwhile, the focus ring 200 illustrated in FIG. 4 is not electrically connected with the susceptor 105 but positioned on the dielectric ring 210 provided therebetween, so that it is difficult for a high frequency power from the susceptor 105 to be transmitted to the focus ring 200. For this reason, even if the voltage of the susceptor 105 (voltage of the wafer W) is, for example, about −1000 V during a plasma process as in a case of FIG. 3, the voltage of the focus ring 200 (floating voltage) does not have the same voltage as the susceptor 105, and the potential of the focus ring 200 has a lower absolute value than the potential of the susceptor 105. For example, if the focus ring 200 has the floating voltage of about −500V, the top surface 223 of the inner ring 222 and the top surface 225 of the outer ring 224 have the same voltage of about −500 V.

Accordingly, in the focus ring 200 illustrated in FIG. 4, there is a potential difference (about 500 V in this case) between the conductive ring 220 (including the inner ring 222 and the outer ring 224) and the wafer W (susceptor 105), and, thus, an electric field E' is generated. As indicated by the dotted line in FIG. 4, equipotential surfaces of the electric field E' are formed between an outer peripheral surface of the wafer W and an inner peripheral surface of the outer ring 224 in an approximately vertical direction, i.e., in a direction where the ions I move from the inner peripheral surface of the outer ring 224 toward the outer peripheral surface of the wafer peripheral portion. Further, the equipotential surfaces are formed between the bottom surface of the wafer peripheral portion and the top surface 223 of the inner ring 222 in an approximately horizontal direction, i.e., in a direction where the ions I move from the top surface 223 of the inner ring 222 toward the rear surface of the wafer peripheral portion.

By such an operation of the electric field E', some of the ions I moving from the plasma P toward the peripheral portion of the wafer W may collide with the outer peripheral surface of the wafer peripheral portion, and other ions I may enter a gap between the outer peripheral surface of the wafer peripheral portion and the inner peripheral surface of the outer ring 224 and, then, other ions I are accelerated in a direction where the ions I collide with the bottom surface (rear surface) of the wafer peripheral portion. Therefore, the ions I from the plasma can collide with the side surface or the bottom surface (rear surface) of the wafer peripheral portion as well as the top surface thereof. Accordingly, it is possible to reduce the deposits D on the side surface of the wafer peripheral portion and the bottom surface (rear surface) thereof.

However, if a potential difference between the wafer W (susceptor 105) and the conductive ring 220 is generated during a plasma process just by insulating the mounting table and the focus ring from each other via the dielectric member provided therebetween as in the focus ring 200 illustrated in FIG. 4, a thickness of the plasma sheath on the wafer W is different from that of the plasma sheath on the focus ring. For this reason, the plasma sheath becomes deformed, and, thus, the electric field E is inclined, particularly, in the vicinity of the wafer peripheral portion.

As the inclination of the electric field E increases, the amount of the ions I introduced into the bottom surface of the wafer peripheral portion can be increased, and, thus, it is possible to increase an effect of reducing deposits on the wafer peripheral portion. However, the incident angle of the ions I moving toward the wafer peripheral portion is also increased, and, thus, inclination of holes or trenches (inclination of an etching profile) formed in the wafer peripheral portion also becomes greater.

In this case, if the height of the focus ring 200 (height of the top surface 225 of the outer ring 224) is further increased, the plasma P on the focus ring 200 can be pushed upward. Accordingly, the deformation of the plasma sheath in the vicinity of the wafer peripheral portion can be decreased, and, thus, inclination of the incident angle of the ions I moving toward the wafer peripheral portion can be improved (see, for example, graph $Y_D$ in FIG. 6). However, if the height of the focus ring 200 is increased, the amount of the ions I introduced into the peripheral portion of the wafer W is decreased, and, thus, the effect of reducing the deposits on the wafer peripheral portion becomes decreased (see graph $Y_I$ in FIG. 6).

Figure 6:
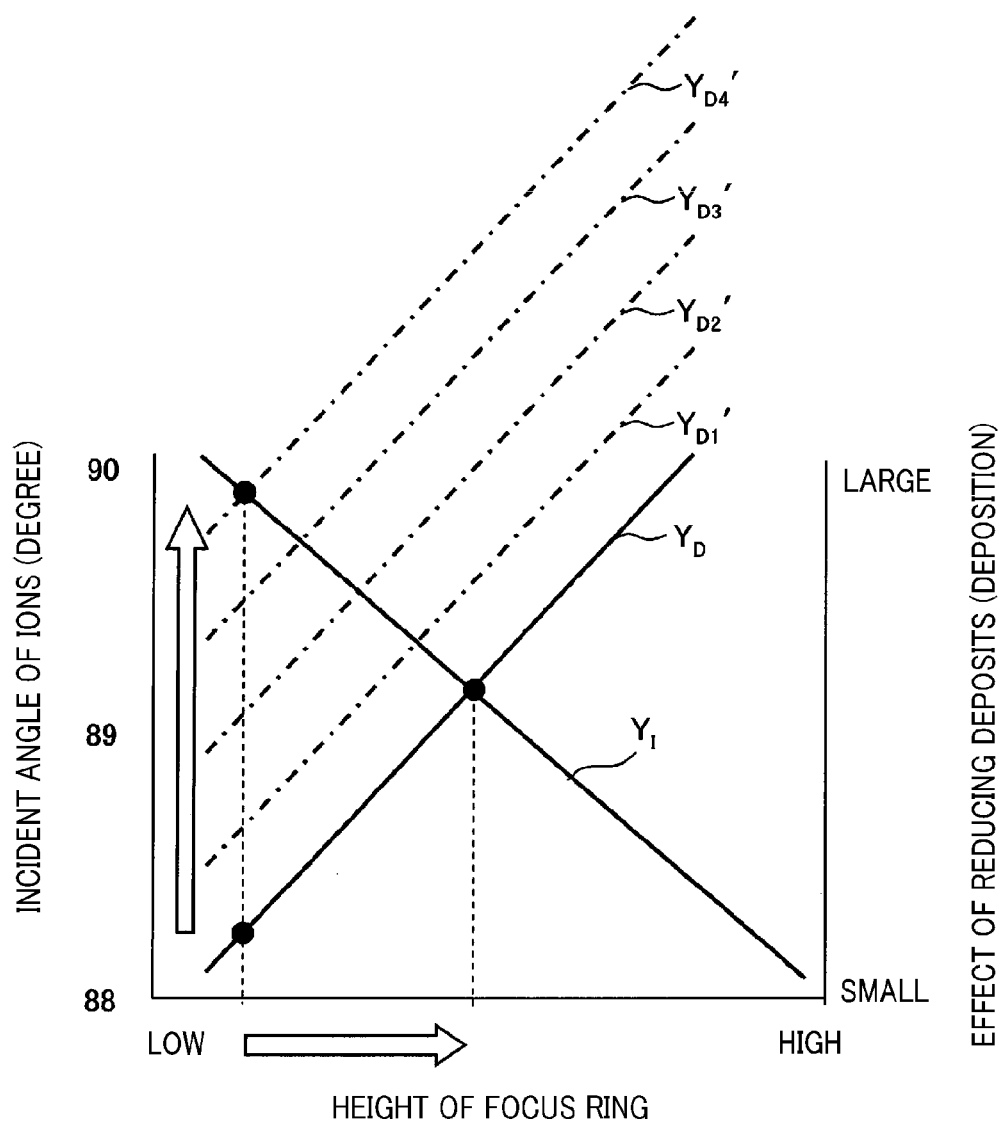
FIG. 6 is a graph showing a relationship between an incident angle of ions and an effect of reducing deposits and a height of a focus ring.

As described above, there is a tradeoff relation between the effect of reducing the deposits on the wafer peripheral portion and the incident angle of the ions I as shown in FIG. 6. Therefore, unless any one of the effect of reducing the deposits in the vicinity of the wafer peripheral portion and the effect of improving the incident angle of the ions becomes decreased by adjusting the height of the focus ring 200 (height of the top surface 225 of the outer ring 224), it is impossible to find a balanced height for the both effects (intersection point between graph $Y_I$ and graph $Y_D$ in FIG. 6). In this way, there is a limit in improving the both effects of reducing the deposits in the vicinity of the wafer peripheral portion and improving the incident angle of the ions in balance just by adjusting the height of the top surface of the outer ring 224 (height of the focus ring 200).

Further, in order to adjust the height of the focus ring 200, it is necessary to prepare a plurality of the focus rings 200 having various heights; perform plasma processes by using the focus rings 200; and select the most suitable one, which requires a lot of time and effort. Further, despite a lot of time and effort spent in selecting the most suitable height of the focus ring 200, the focus ring 200 may be eroded by repeated plasma processes, and, thus, its height may be changed. Therefore, the plasma sheath becomes deformed again. In this case, the height of the focus ring 200 cannot be minutely adjusted, and, thus, whenever a process result such as inclination of the holes or the trenches exceeds tolerance, the focus ring 200 should be replaced. Further, if conditions of the plasma etching process are changed, a potential to be applied to the wafer W or a state of the plasma sheath is changed. Therefore, a focus ring having an optimum height for each plasma process condition should be designed again.

Figure 5:
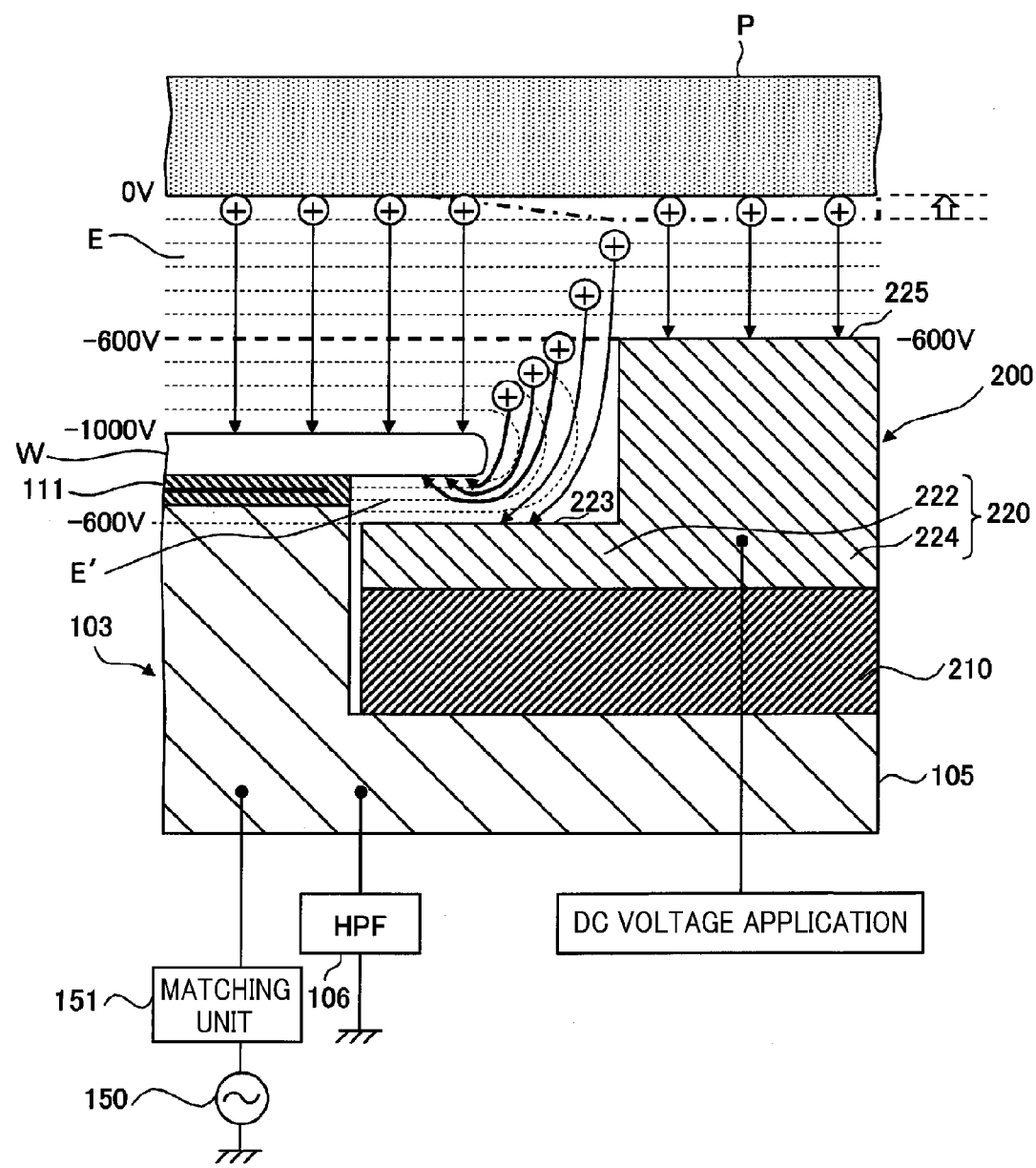
FIG. 5 is a view for explaining an operation of the focus ring when a DC voltage is applied to the focus ring illustrated in FIG. 4.

In this case, instead of changing the height of the focus ring 200 (height of the top surface of the outer ring 224), for example, the plasma P above the outer ring 224 can be pushed upward by applying an optimum DC voltage (−600 V in this case) to the conductive ring 220 as illustrated in FIG. 5. In this way, the deformation of the plasma sheath in the vicinity of the wafer peripheral portion can be decreased, and, thus, it is possible to improve the effects of reducing the deposits D (particularly, deposits on the rear surface) on the peripheral portion of the wafer W as well as improving the incident angle of the ions I. However, in accordance with the conventional method, it is required to detect plasma peripheral portion and predict or detect the degree of erosion of the focus ring so as to find or adjust an optimum application voltage. Therefore, process or configuration becomes complicated to find such an optimum application voltage or its adjustment voltage.

The present inventor has studied a method of effectively finding an optimum application voltage for increasing both the effect of reducing deposits on a peripheral portion of a substrate and the effect of improving a process result (e.g., inclination of an etching profile) without changing a shape (e.g., height of a top surface) of a focus ring.

For example, as depicted in FIG. 4, it is assumed that the floating voltage is about −500 V when the plasma P is generated without application of the voltage to the conductive ring 220, and it is further assumed that the ions I are incident to the wafer W without collision. In such a case, an acceleration starting position of the ions I reaching the bottom surface of the wafer peripheral portion is deemed to be a position at the same potential as that on the top surface 223 of the inner ring 222, i.e., a position at a potential of about −500 V on the top surface 225 of the outer ring 224.

For this reason, as depicted in FIG. 4, although the ions I in the plasma P enter a gap between the outer peripheral surface of the wafer peripheral portion and the inner peripheral surface of the outer ring 224, only some ions I which are accelerated from a side (side closer to the wafer W than the equipotential surface of about −500 V) lower than the potential (about −500 V) on the top surface 225 of the outer ring 224 may reach the bottom surface of the peripheral portion of the wafer W. Other ions I which are accelerated from a side (side closer to the plasma P than the equipotential surface of about −500 V) higher than that potential (about −500 V) on the top surface 225 of the outer ring 224 may collide with the top surface of the inner ring 222 and become extinct.

Accordingly, it can be seen that if the floating voltage, i.e., the application voltage to be applied to the conductive ring 220 is set to be in the range from the potential (about −500 V) on the top surface 225 of the conductive ring 220 to the potential (about −1000 V) on the wafer W, it is difficult to improve the effect of reducing the deposits on the wafer peripheral portion. In other words, if an actual floating voltage of the conductive ring 220 can be detected, the application voltage to be applied to the conductive ring 220 can be determined between the potential (about −500 V) and the plasma potential (about 0 V). Accordingly, it is sufficient that dummy plasma processes or simulation experiments are carried out by using such an application voltage range. That is, it is not necessary to perform unnecessary plasma processes or simulations by using other application voltages, and, thus, efficiency is greatly improved.

As described above, the focus ring has a configuration in which the conductive ring 220 is provided on the susceptor 105 via the dielectric ring 210 and floated. With this configuration, it can be seen that if the floating voltage on the conductive ring 220 is detected when the plasma is generated, the application voltage can be determined between the potential of the conductive ring 220 and the plasma potential, so that it is possible to effectively find the optimum application voltage for increasing both effects of reducing the deposits on the wafer peripheral portion and improving the incident angle of the ions in balance.

For example, as depicted in FIG. 6, a graph $Y_D$ represents a relationship between the height of the focus ring 200 and the incident angle of the ions when only the floating voltage is shown on the conductive ring 220. If an application voltage is added thereto while gradually changing the value of the application voltage, the graph $Y_D$ is changed to graphs $Y_{D1}'$, $Y_{D2}'$, $Y_{D3}'$, and $Y_{D4}'$ without a decrease in the effect of reducing the deposits on the wafer peripheral portion. Accordingly, it is possible to find a point (intersection point between graph $Y_{D4}'$ and graph $Y_I$ in FIG. 6) at which the incident angle of the ions can be best improved, and a voltage at that point may be deemed to be an optimum application voltage.

The floating voltage may vary depending on a degree of erosion of the focus ring 200 or a change in a state of the plasma. Accordingly, even if the focus ring is eroded, it is possible to maintain an optimum state regardless of the change of the floating voltage by using the accurate and simple method of adjusting only the optimum application voltage for each plasma process in consideration of a variation in the floating voltage.

In the present embodiment, the focus ring 200 is in a floating state with respect to the mounting table 103, and a focus ring device is configured such that a DC voltage can be applied to the conductive ring 220. In this focus ring device, an optimum application voltage can be found based on the floating voltage of the conductive ring 220 and the optimum application voltage can be adjusted depending on a variation in the floating voltage.

Accordingly, without changing the height (height of the top surface 225) of the focus ring 200, it is possible to effectively find an optimum application voltage for improving the both effects of reducing the deposits on the wafer peripheral portion and improving the incident angle of the ions in balance, and the optimum application voltage can be accurately and simply adjusted. Therefore, a replacement frequency of the focus ring 200 can be reduced as compared to the conventional way, so that it is possible to decrease a downtime or cost for components required for replacement as compared to the conventional way.

Further, while the deposits on the wafer peripheral portion are reduced, the incident angle of the ions I moving toward the wafer peripheral portion can be approximately vertical (about 90 degrees). Therefore, a process result, such as inclination of the holes or trenches (inclination of an etching profile), can be improved as compared to the conventional way, so that it is possible to increase uniformity of the process in the wafer surface.

(Configuration Example of Focus Ring Device)

Hereinafter, there will be explained a configuration example of a focus ring device with reference to FIG. 7. In a focus ring device 250 illustrated in FIG. 7, the conductive ring 220 is connected with a DC power supply 230 for applying a DC voltage thereto. The DC power supply 230 can apply a required DC voltage to the conductive ring 220 under the control of the controller 300. Further, a low pass filter (LPF) 232 for filtering a high frequency current introduced from the susceptor 105 is provided between the DC power supply 230 and the conductive ring 220.

Further, provided between the conductive ring 220 and the DC power supply 230 is a voltage sensor 234 for detecting a floating voltage of the conductive ring 220. The output of the voltage sensor 234 is sent to the controller 300.

Figure 8:
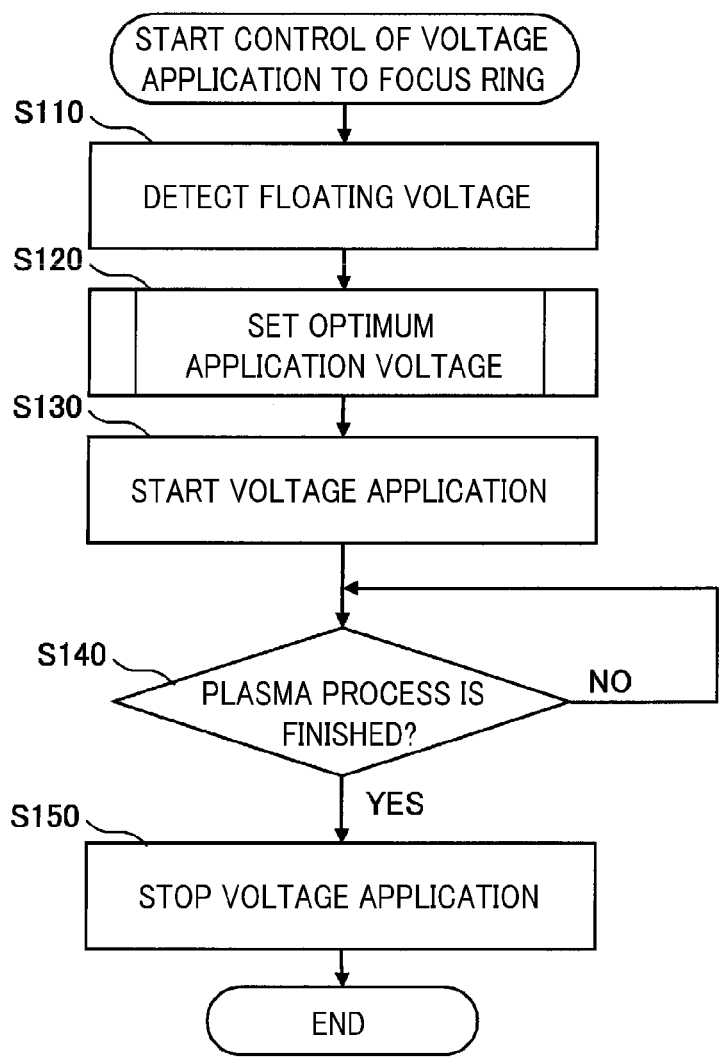
FIG. 8 is a flowchart showing a main routine for controlling a voltage applied to the focus ring in accordance with the present embodiment.

Hereinafter, there will be explained a control of a voltage application to the focus ring 200 of the focus ring device 250 in accordance with the present embodiment. FIG. 8 is a flowchart schematically showing a main routine for controlling a voltage application by the controller 300. First of all, as depicted in FIG. 8, a floating voltage of the conductive ring 220 is detected in step S110. To be specific, when plasma is generated in a state that the DC power supply 230 is turned off, a voltage of the conductive ring 220 is detected as a floating voltage by the voltage sensor 234.

Figure 9:
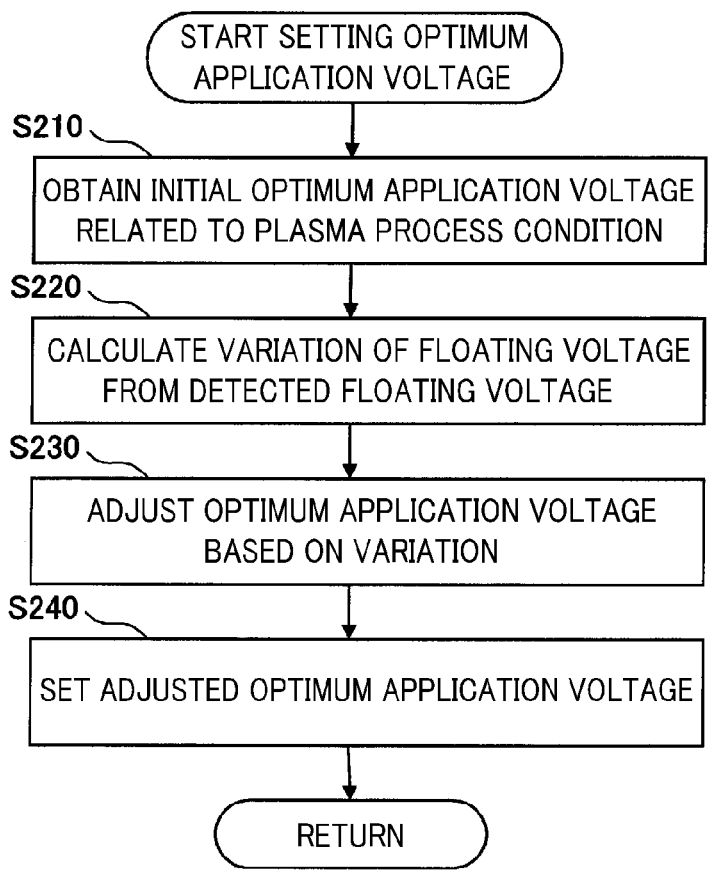
FIG. 9 is a flowchart showing a sub-routine for setting an optimum application voltage in case of using the focus ring device illustrated in FIG. 7.

Subsequently, in step S120, an optimum application voltage to be applied to the conductive ring 220 is set. Such a setting is carried out according to, for example, a flowchart of a sub-routine illustrated in FIG. 9. First, as depicted in FIG. 9, in step S210, an optimum application voltage related to a selected plasma process condition is obtained with reference to, for example, a data table as shown in FIG. 10. The data table as shown in FIG. 10 is previously stored in the storage 320 by obtaining an initial optimum application voltage value depending on an initial floating voltage for each plasma process condition.

For example, if a plasma process condition X is selected, an initial floating voltage is $F_0(X)$ and an initial optimum application voltage is $R_0(X)$ from its corresponding application voltage data. By way of example, the initial floating voltage is a floating voltage when plasma is first generated after the focus ring 200 is replaced or newly provided.

The initial optimum application voltage is obtained by adding an optimum voltage to initial floating voltage. For example, an application voltage, i.e., the initial floating voltage plus an added voltage, is applied to the conductive ring 220 while gradually changing the value of the added voltage, and then dummy plasma processes or simulation experiments may be carried out. For example, in the simulation experiment, a plasma sheath, an electrolytic structure, or a trajectory of ions on the wafer peripheral portion or on the conductive ring 220 may be calculated.

Further, when the plasma process is performed under the selected process condition, a voltage (for example, a voltage at the intersection point of graphs $Y_I$ and $Y_{D4}'$ in FIG. 6) capable of enhancing both effects of reducing deposits on the wafer peripheral portion and improving an incident angle of ions in balance is obtained as the initial optimum application voltage. The optimum value of the voltage (e.g., $R_0(X)-F_0(X)$) to be added to the initial floating voltage (e.g., $F_0(X)$) may vary depending on each plasma process condition.

Thereafter, in step S220, a variation is calculated from the detected floating voltage, and in step S230, the optimum application voltage value is adjusted depending on the variation. For example, if an initial floating voltage is $F_0(X)$ and the floating voltage detected in step S110 is $F(X)$, a variation therebetween can be expressed by $F_0(X)-F(X)$. Therefore, if the initial optimum application voltage value obtained in step S210 is $R_0(X)$, an optimum application voltage value $R(X)$ adjusted depending on the variation can be expressed by, for example, the following equation (1).

$$R(X)=(F_0(X)-F(X))+R_0(X) \tag{1}$$

As described above, since the optimum application voltage value is adjusted depending on the variation of the initial floating voltage, although the floating voltage is changed due to erosion of the focus ring 200, it is possible to maintain a state before the change of the floating voltage.

Then, in step S240, the adjusted optimum application voltage value is set as a DC voltage to be applied to the conductive ring 220, and the process returns to step S130 of the main routine of FIG. 8.

Subsequently, in step S130, the DC voltage is applied to the conductive ring 220 by controlling the DC power supply 230. Then, in step S140, it is determined whether or not the plasma process is finished. If it is determined that the plasma process is finished, the DC power supply 230 turns off so as to stop applying the DC voltage and a series of controls of a voltage application is ended in step S150.

As described above, an initial optimum application voltage value is previously obtained depending on an initial floating voltage of the conductive ring 220 for each plasma process condition. Then, whenever a plasma process is performed, an optimum application voltage value is adjusted depending on a variation in the floating voltage. Thereafter, the plasma process is performed on the wafer W while the adjusted optimum application voltage is applied to the conductive ring 220. Accordingly, even if a state of the plasma sheath or a potential of the wafer W is changed due to a change in a process condition or erosion of the focus ring 200, it is possible to maintain a state before the change.

Further, in the focus ring device in accordance with the above-described embodiment, there has been explained a case of using the focus ring 200 including the inner ring 222 and the outer ring 224 as one body, but the present disclosure is not limited to such a case. Therefore, it may be possible to use the focus ring 200 including the inner ring 222 and the outer ring 224 as separate bodies. In this case, a DC voltage may be applied to any one of the inner ring 222 and the outer ring 224 or may be independently applied to each of the both rings.

Figure 11:
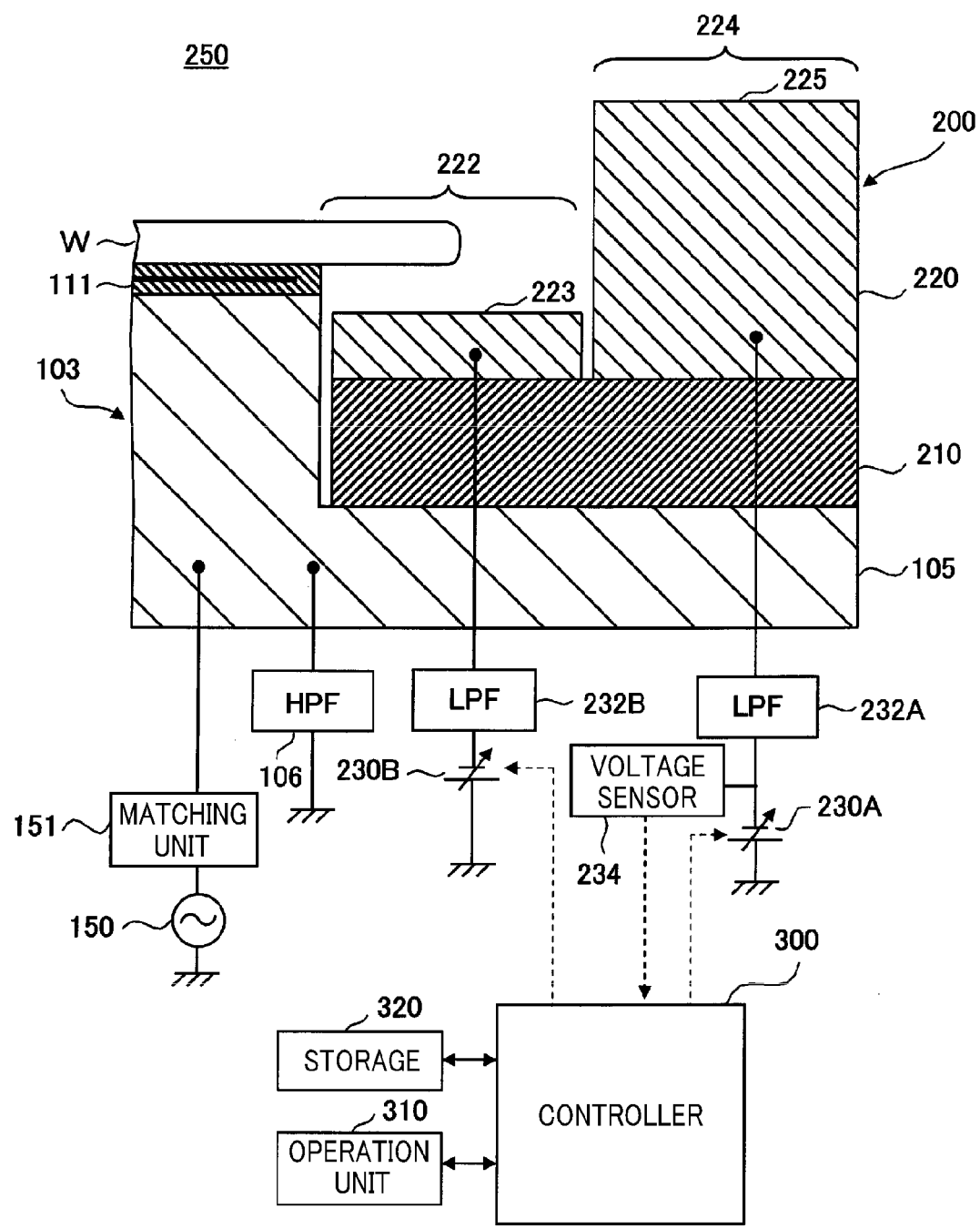
FIG. 11 is a partial cross sectional view for explaining a modified example of the focus ring device in accordance with the present embodiment.

Hereinafter, there will be explained a modified example of the focus ring device 250 with reference to the drawings. In this case, there will be explained the focus ring device 250 using the focus ring 200 including the inner ring 222 and the outer ring 224 as separate bodies. FIG. 11 is a view for explaining a modified example of a focus ring device and FIG. 11 corresponds to FIG. 7. In FIG. 11, same parts having substantially the same functions as those of FIG. 7 are assigned same reference numerals and detailed explanation thereof will be omitted.

In the focus ring 200 illustrated in FIG. 11, the inner ring 222 and the outer ring 224 are electrically insulated from each other via a gap. Further, in the same manner as shown in FIG. 7, the inner ring 222 and the outer ring 224 are electrically insulated from the susceptor 105 by the dielectric ring 210.

Furthermore, the conductive rings 220 (the outer ring 224 and the inner ring 222) are in electrical contact with only the dielectric ring 210, and, thus, the conductive rings 220 are in an electrically floating state (insulating state) with respect to a ground.

The outer ring 224 and the inner ring 222 are connected with a DC power supply 230A for the outer ring and a DC power supply 230B for the inner ring, respectively. Provided between the DC power supply 230A for the outer ring and the outer ring 224 is a low pass filter (LPF) 232A for filtering a high frequency current introduced from the susceptor 105. Further, provided between the DC power supply 230B for the inner ring and the inner ring 222 is a low pass filter (LPF) 232B for filtering the high frequency current introduced from the susceptor 105.

Moreover, in this case, the voltage sensor 234 is connected between the outer ring 224 and the DC power supply 230A for the outer ring to detect a floating voltage of only the outer ring 224. Since the inner ring 222 may not be eroded as much as the outer ring 224, a variation in a floating voltage of the inner ring 222 may be small.

In accordance with the focus ring device 250 configured as stated above, different DC voltages from each other can be applied to the outer ring 224 and the inner ring 222. For example, if the variation of the floating voltage is large because the top surface 225 of the outer ring 224 is cut down due to erosion of the focus ring, an application voltage to be adjusted also becomes increased. In this case, if the outer ring 224 and the inner ring 222 are formed as one body like the focus ring 200 illustrated in FIG. 7, the inner ring 222 has the same potential as the eroded outer ring 224. Therefore, as the application voltage increases, a potential difference between the bottom surface of the wafer peripheral portion and the top surface 223 of the inner ring 222 becomes decreased. Accordingly, even if ions I in the plasma enter a gap between the wafer W and an inner peripheral surface of the outer ring 224, it is difficult for the ions I to be introduced into a bottom surface (rear surface) of the wafer peripheral portion.

In the focus ring 200 illustrated in FIG. 11, however, the outer ring 224 and the inner ring 222 are formed as separate bodies, and, thus, it is possible to apply a different DC voltage to the inner ring 222 from that applied to the outer ring 224. For this reason, a DC voltage adjusted depending on the erosion can be applied to the outer ring 224 while a DC voltage capable of securing a potential difference between the bottom surface of the wafer peripheral portion and the top surface 223 of the inner ring 222 can be applied to the inner ring 222.

For example, a voltage of about −600 V can be applied to the outer ring 224 in the same manner as illustrated in FIG. 5 and a voltage of, e.g., about −400 V can be applied to the inner ring 222. As a result, between the bottom surface of the wafer peripheral portion and the top surface 223 of the inner ring 222, it is possible to secure a potential difference of about 600 V larger than a potential difference of about 400 V in FIG. 5. Accordingly, the ions I in the plasma can be easily introduced into the bottom surface (rear surface) of the wafer peripheral portion, and, thus, it is possible to increase the effect of reducing the deposits on the wafer peripheral portion.

Hereinafter, there will be explained a control of a voltage application to a focus ring by using a focus ring device illustrated in FIG. 11 with reference to the drawings. The control of the voltage application to the focus ring device illustrated in FIG. 11 is also carried out according to the flow chart shown in FIG. 8. First of all, in step S110, a floating voltage is detected. At this time, a floating voltage of only the outer ring 224 is detected. To be specific, plasma is generated when each of the DC power supplies 230A and 230B turns off, and at this time, the voltage of only the outer ring 224 is detected by the voltage sensor 234 as a floating voltage.

Figure 12:
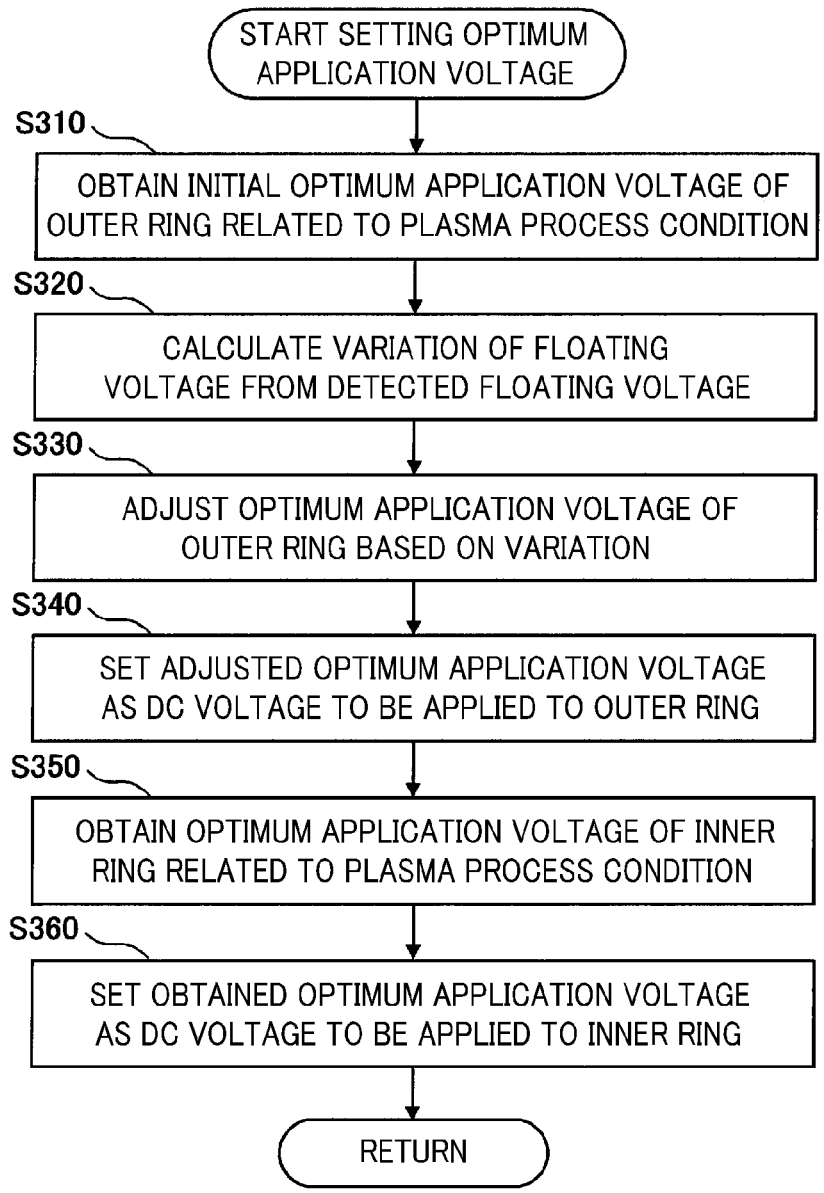
FIG. 12 is a flowchart showing a sub-routine for setting an optimum application voltage in case of using the focus ring device illustrated in FIG. 11.

Then, in step S120, an optimum application voltage value to be applied to the conductive ring 220 is set. Such a setting is carried out according to, for example, a flowchart of a sub-routine illustrated in FIG. 12. As depicted in FIG. 12, in step S310, an initial optimum application voltage of the outer ring 224 related to a selected plasma process condition is obtained with reference to, for example, a data table as shown in FIG. 13. The data table as shown in FIG. 13 is previously stored in the storage 320 and the data table includes, for each plasma process condition, an optimum application voltage value of the inner ring 222 and an optimum application voltage value of the outer ring 224 depending on an initial floating voltage value of the outer ring 224.

For example, if a plasma process condition X is selected, an optimum application voltage value $r_0(X)$ of the inner ring 222, an initial floating voltage value $F_0(X)$, and an initial optimum application voltage value $R_0(X)$ of the outer ring 224 are read from its corresponding voltage data. Each of the optimum application voltage values of the inner ring 222 and the outer ring 224 is determined by obtaining a voltage value capable of enhancing both effects of reducing deposits on the wafer peripheral portion and improving an incident angle of ions in balance through a dummy plasma process or an simulation experiment when the plasma process is performed under the selected process condition in the same manner as illustrated in FIG. 10.

In steps S320 to S340, the same processes as performed in steps S220 to S240 are performed on only the outer ring 224. That is, a variation of the floating voltage is calculated based on the detected floating voltage in step S320, and the optimum application voltage value for the outer ring 224 is adjusted based on the variation in step S330. Then, the adjusted optimum application voltage value is set as a DC voltage to be applied to the conductive ring 220 in step S340.

Thereafter, in step S350, the optimum application voltage value of the inner ring 222 related to the plasma process condition is read with reference to, e.g., the data table in FIG. 13. The optimum application voltage value of the inner ring 222 may vary depending on each plasma process condition. However, since the floating voltage of the inner ring 222 is hardly changed under the same plasma process condition, it is deemed that there is no need to change the optimum application voltage value of the inner ring 222 depending on its floating voltage.

Then, in step S360, the read optimum application voltage value of the inner ring 222 is set as a DC voltage to be applied to the inner ring 222, and the process returns to step S130 of the main routine of FIG. 8.

Subsequently, in step S130, the DC voltages are applied to the inner ring 222 and the outer ring 224, respectively, by controlling the respective DC power supplies 230A and 230B. Then, in step S140, it is determined whether or not the plasma process is finished. If it is determined that the plasma process is finished, the respective DC power supplies 230A and 230B turns off so as to stop applying the DC voltages and a series of controls of a voltage application is ended in step S150.

In this way, the optimum application voltage value of the inner ring 222 is set for each process condition, and the optimum application voltage value of the outer ring 224 is set depending on the floating voltage detected whenever the plasma process is performed. Accordingly, it is possible to easily optimize a voltage to be applied to the outer ring 224 depending on erosion of the focus ring 200 for each plasma process condition, and in addition, it is possible to maintain an optimum potential difference between the wafer W and the inner ring 222. For this reason, the effect of reducing the deposits on the wafer peripheral portion can be further increased.

Figure 7:
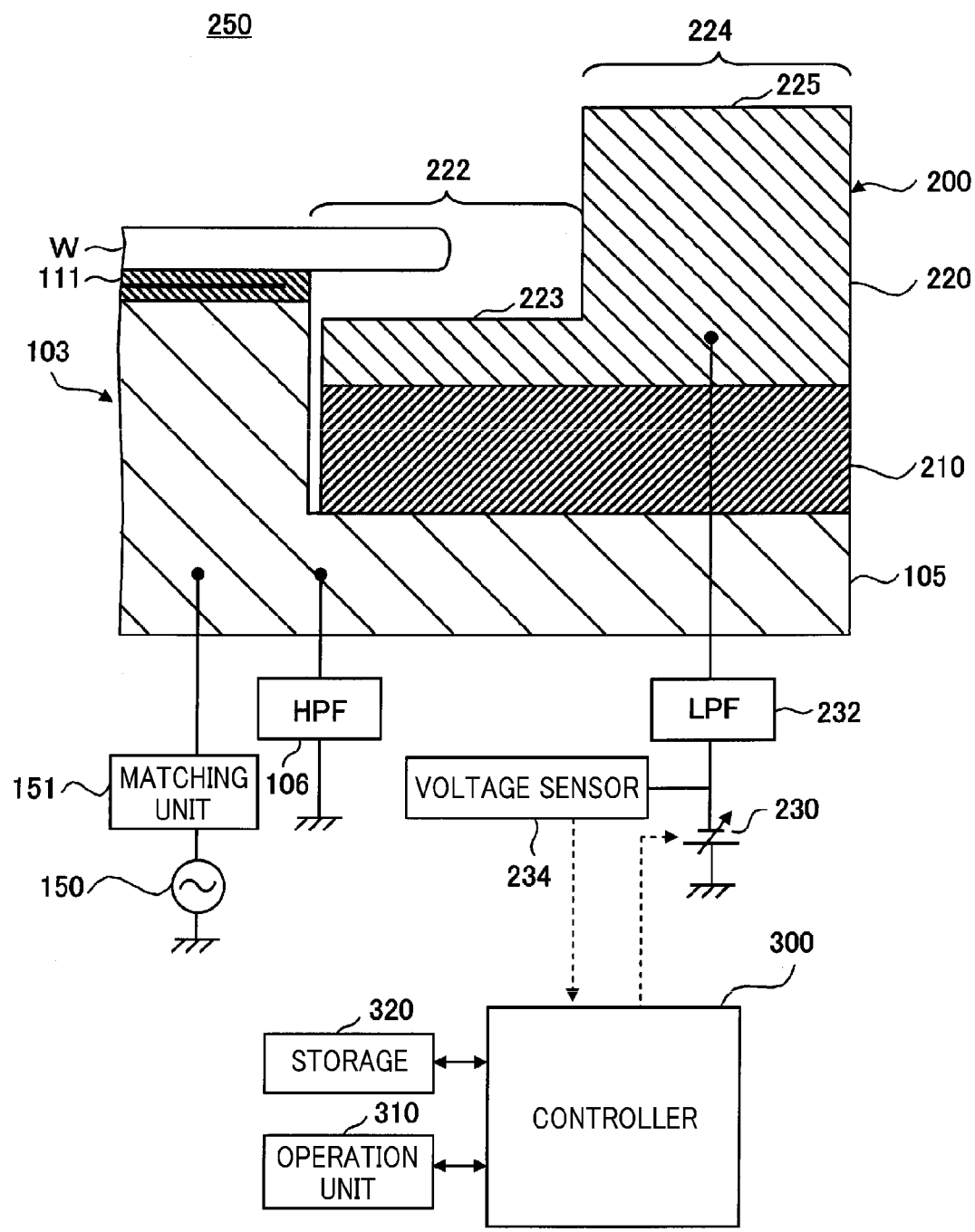
FIG. 7 is a partial cross sectional view for explaining a configuration example of a focus ring device in accordance with the present embodiment.
Figure 14:
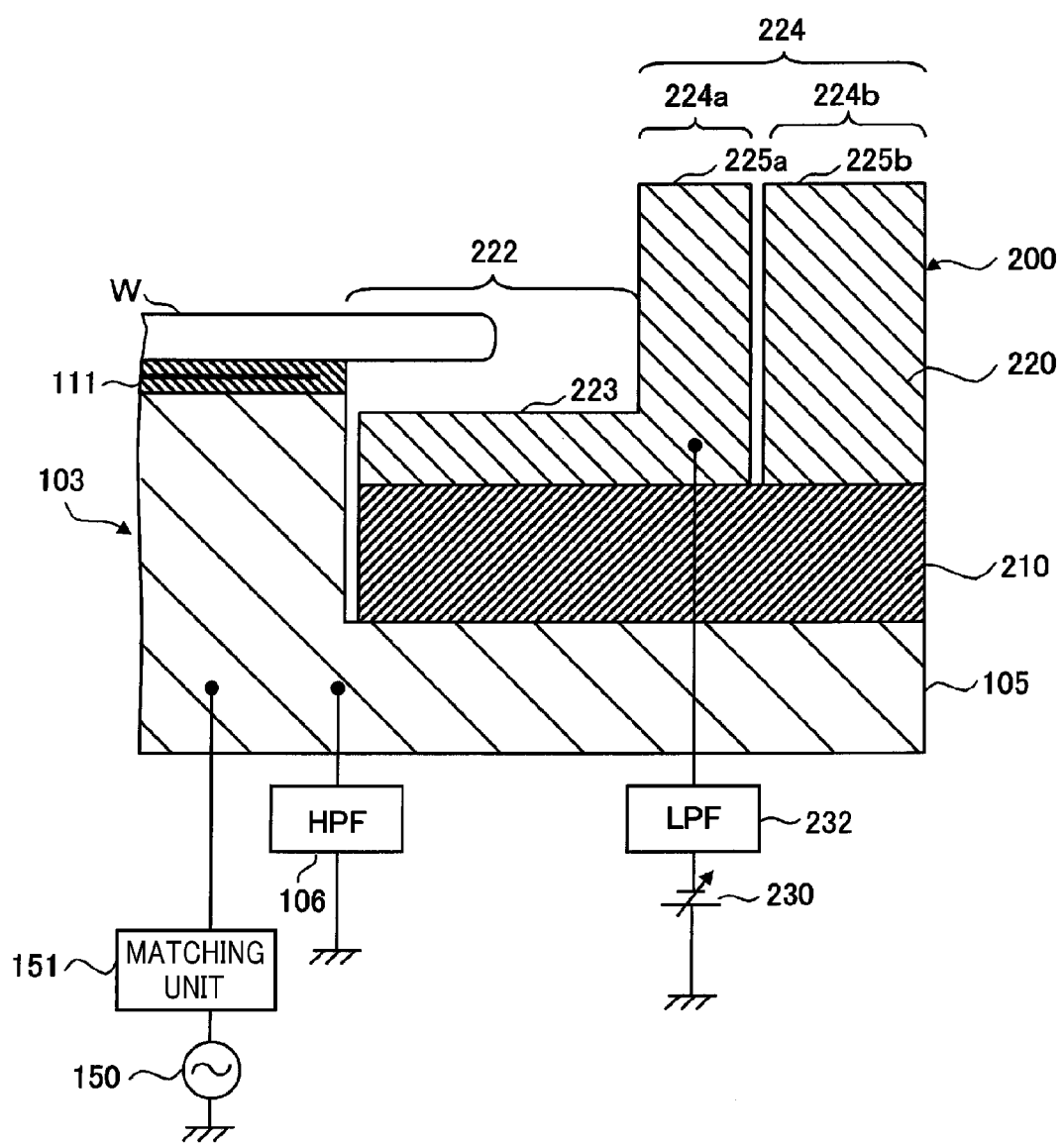
FIG. 14 shows a modified example of the focus ring illustrated in FIG. 7.
Figure 15:
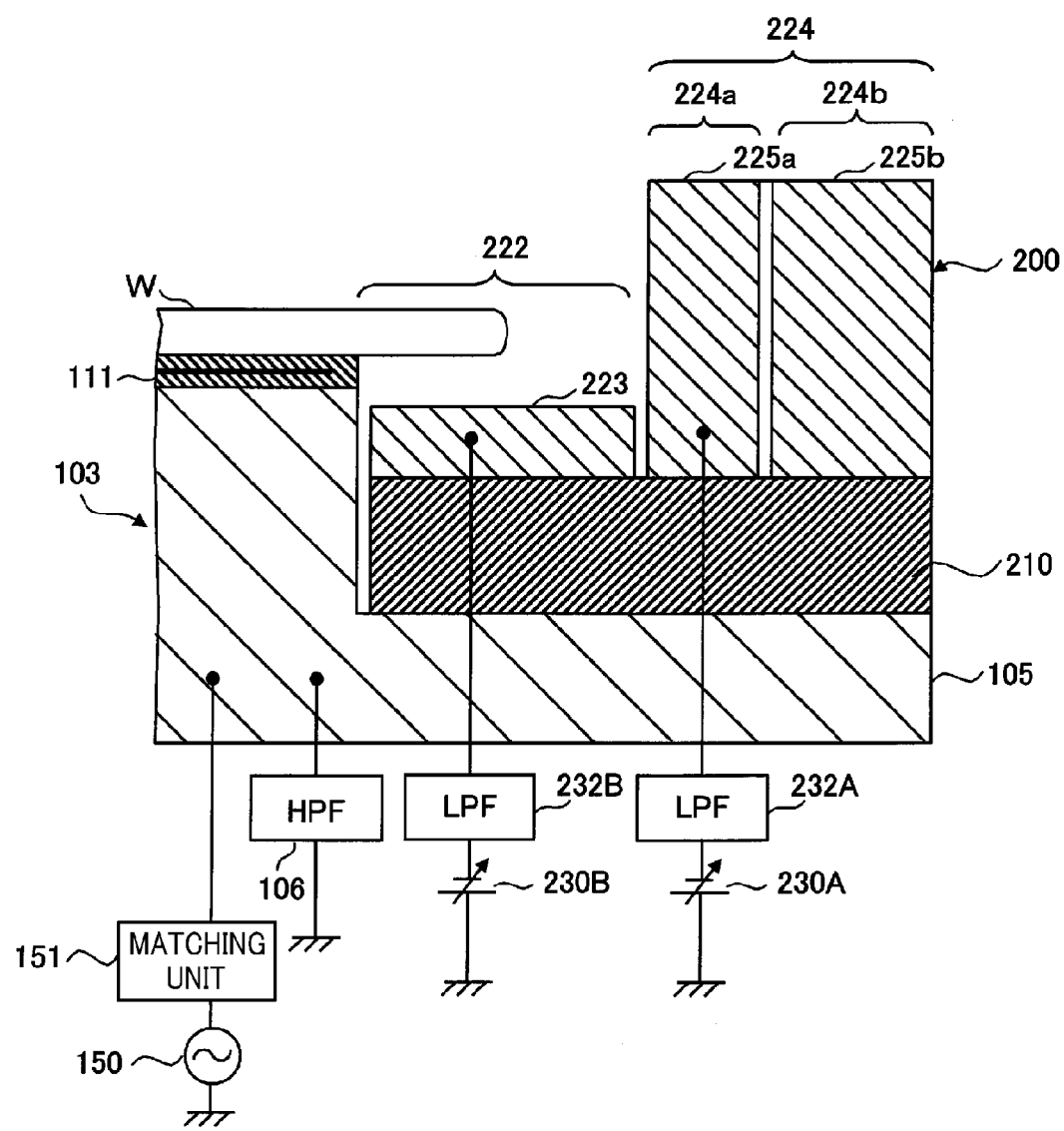
FIG. 15 shows another modified example of the focus ring illustrated in FIG. 11.

The configurations of the focusing rings 200 illustrated in FIGS. 7 and 11 are not limited to the above-described embodiments. For example, as illustrated in FIGS. 14 and 15, the outer rings 224 may be divided into an inner peripheral portion 224a and an outer peripheral portion 224b, and a DC voltage may be applied not to the outer peripheral portion 224b but to the inner peripheral portion 224a. With this configuration, it is possible to adjust only a plasma sheath on the inner peripheral portion 224a, which mainly exerts an influence on reduction in deposits on the wafer peripheral end portion or an incident angle of ions. Accordingly, a DC voltage application area can be reduced, and, thus, a DC power supply 230 in FIG. 14 and a DC power supply 230A for the outer ring in FIG. 15 can be further miniaturized.

Further, the shape of the outer ring 224 is not limited to those illustrated in FIGS. 2, 7, and 11. For example, it may be possible to form an inclined surface gradually lowered to the inner side (wafer W's side) at the inner peripheral portion of the top surface 225 of the outer ring 224. With this configuration, the top surface 225 of the outer ring 224 is divided into a horizontal surface on the outer side and the inclined surface on the inner side, and, thus, a variation in a sheath thickness on a boundary between the outer ring 224 and the wafer W can be decreased.

Furthermore, in the above-described embodiments, there has been explained a case where the bottom surface of the conductive ring 220 is accurately the same in size as the top surface of the dielectric ring 210, but the present disclosure is not limited to such a case. For example, the conductive ring 220 may be larger than the dielectric ring 210 in a diametric direction.

There have been explained the embodiments of the present invention with reference to the accompanying drawings, but it is clear that the above-described embodiments are illustrative in all aspects and do not limit the present invention. It would be understood by those skilled in the art that various changes and modifications may be made without changing technical conception and essential features described in the following claims and their equivalents are included in the scope of the present invention.

The present disclosure can be applied to a plasma processing apparatus including a mounting table for mounting thereon a substrate and a focus ring installed on the mounting table so as to surround the substrate, a plasma processing method, and a program.

What is claimed is:

1. A plasma processing method for performing a plasma process on a substrate in a plasma processing apparatus which includes a mounting table for mounting thereon the substrate and a focus ring provided on the mounting table so as to surround the substrate, wherein the focus ring includes a dielectric ring provided so as to surround a substrate mounting portion of the mounting table and a conductive ring provided on the dielectric ring, the conductive ring is connected with a voltage sensor for detecting a floating voltage thereof and a DC power supply for applying a DC voltage thereto, the conductive ring includes an outer ring and an inner ring as one body, the outer ring being provided so as to surround a peripheral portion of the substrate and having a top surface higher than the substrate mounted on the substrate mounting portion, and the inner ring extending inwardly from the outer ring so as to be positioned under the peripheral portion of the substrate and having a top surface lower than the substrate, further wherein the plasma processing method comprises:

obtaining an optimum application voltage value to be applied to the conductive ring based on a floating voltage of the conductive ring detected by the voltage sensor and storing the obtained optimum application voltage value in a storage;

when a plasma process is performed, detecting a floating voltage of the conductive ring by the voltage sensor for each plasma process, obtaining a variation of the floating voltage, and adjusting the optimum application voltage value stored in the storage based on the variation in the floating voltage; and performing the plasma process on the substrate by applying a voltage corresponding to the adjusted optimum application voltage value to the conductive ring from the DC power supply.

2. The plasma processing method of claim 1, wherein the outer ring is divided into an outer peripheral portion and an inner peripheral portion, the inner peripheral portion is electrically connected with the inner ring and the outer peripheral portion is electrically insulated from the inner peripheral portion and the inner ring, and the DC power supply and the voltage sensor are connected with the inner peripheral portion or the inner ring.

3. The plasma processing method of claim 1, further comprising:

if it is allowed to select one among a plurality of plasma process conditions, obtaining an optimum application voltage value to be applied to the conductive ring based on a floating voltage of the conductive ring detected by the voltage sensor for each of the plasma process conditions and storing the obtained optimum application voltage value in the storage;

when a plasma process is performed under the selected plasma process condition, detecting a floating voltage of the conductive ring by the voltage sensor for each plasma process, obtaining a variation of the floating voltage, and adjusting the optimum application voltage value stored in the storage and related to the selected plasma process condition based on the variation in the floating voltage; and performing the plasma process on the substrate under the plasma process condition by applying a voltage corresponding to the adjusted optimum application voltage value to the conductive ring from the DC power supply.

4. The plasma processing method of claim 3, wherein the outer ring is divided into an outer peripheral portion and an inner peripheral portion, the inner peripheral portion is electrically connected with the inner ring and the outer peripheral portion is electrically insulated from the inner peripheral portion and the inner ring, and the DC power supply and the voltage sensor are connected with the inner peripheral portion or the inner ring.

5. The plasma processing method of claim 1, wherein the optimum application voltage value is most suitable to increase both an effect of reducing deposits on the peripheral portion of the substrate and an improvement in a process result.

6. The plasma processing method of claim 3, wherein the optimum application voltage value is most suitable to increase both an effect of reducing deposits on the peripheral portion of the substrate and an improvement in a process result.

7. The plasma processing method of claim 5, wherein the outer ring is divided into an outer peripheral portion and an inner peripheral portion,
the inner peripheral portion is electrically connected with the inner ring and the outer peripheral portion is electrically insulated from the inner peripheral portion and the inner ring, and
the DC power supply and the voltage sensor are connected with the inner peripheral portion or the inner ring.

8. A plasma processing method for performing a plasma process on a substrate in a plasma processing apparatus which includes a mounting table for mounting thereon the substrate and a focus ring provided on the mounting table so as to surround the substrate,
wherein the focus ring includes a dielectric ring provided so as to surround a substrate mounting portion of the mounting table and a conductive ring provided on the dielectric ring,
the conductive ring includes an outer ring and an inner ring as separate bodies, the outer ring being provided so as to surround a peripheral portion of the substrate and having a top surface higher than the substrate mounted on the substrate mounting portion, and the inner ring being spaced apart inwardly from the outer ring so as to be positioned under the peripheral portion of the substrate and having a top surface lower than the substrate, and
the outer ring and the inner ring are connected with a DC power supply for the outer ring and a DC power supply for the inner ring, respectively, and the outer ring is connected with a voltage sensor for detecting a floating voltage thereof,
further wherein the plasma processing method comprises:
obtaining an optimum application voltage value to be applied to the outer ring based on a floating voltage of the outer ring detected by the voltage sensor and an optimum application voltage value to be applied to the inner ring, and storing the obtained optimum application voltage values in a storage;
when a plasma process is performed, detecting a floating voltage of the outer ring by the voltage sensor for each plasma process, obtaining a variation in the floating voltage, and adjusting the optimum application voltage value of the outer ring stored in the storage based on the variation in the floating voltage; and
performing the plasma process on the substrate by applying a voltage corresponding to the adjusted optimum application voltage value of the outer ring to the outer ring from the DC power supply for the outer ring and by applying a voltage corresponding to the optimum application voltage value of the inner ring stored in the storage to the inner ring from the DC power supply for the inner ring.

9. The plasma processing method of claim 8, wherein the outer ring is divided into an outer peripheral portion and an inner peripheral portion,
the inner peripheral portion is electrically insulated from the inner ring and the outer peripheral portion is electrically insulated from the inner peripheral portion and the inner ring, and
the DC power supply for the outer ring and the voltage sensor are connected with the inner peripheral portion.

10. The plasma processing method of claim 8, wherein the optimum application voltage value is most suitable to increase both an effect of reducing deposits on the peripheral portion of the substrate and an improvement in a process result.

11. The plasma processing method of claim 10, wherein the outer ring is divided into an outer peripheral portion and an inner peripheral portion,
the inner peripheral portion is electrically insulated from the inner ring and the outer peripheral portion is electrically insulated from the inner peripheral portion and the inner ring, and
the DC power supply for the outer ring and the voltage sensor are connected with the inner peripheral portion.

12. The plasma processing method of claim 8, further comprising:
if it is allowed to select one among a plurality of plasma process conditions, obtaining an optimum application voltage value to be applied to the outer ring based on a floating voltage of the outer ring detected by the voltage sensor for each of the plasma process conditions, obtaining an optimum application voltage value to be applied to the inner ring for each of the plasma process conditions, and storing the obtained optimum application voltage values in the storage;
when a plasma process is performed, detecting a floating voltage of the outer ring by the voltage sensor under the selected plasma process condition, obtaining a variation of the floating voltage, and adjusting the optimum application voltage value of the outer ring stored in the storage and related to the selected plasma process condition based on the variation in the floating voltage; and
performing the plasma process on the substrate by applying a voltage corresponding to the adjusted optimum application voltage value of the outer ring to the outer ring from the DC power supply for the outer ring and by applying a voltage corresponding to the optimum application voltage value of the inner ring stored in the storage and related to the selected plasma process condition to the inner ring from the DC power supply for the inner ring.

13. The plasma processing method of claim 12, wherein the optimum application voltage value is most suitable to increase both an effect of reducing deposits on the peripheral portion of the substrate and an improvement in a process result.

14. The plasma processing method of claim 12, wherein the outer ring is divided into an outer peripheral portion and an inner peripheral portion,
the inner peripheral portion is electrically insulated from the inner ring and the outer peripheral portion is electrically insulated from the inner peripheral portion and the inner ring, and
the DC power supply for the outer ring and the voltage sensor are connected with the inner peripheral portion.

* * * * *